US008124526B2

(12) United States Patent
Choi et al.

(10) Patent No.: US 8,124,526 B2
(45) Date of Patent: Feb. 28, 2012

(54) METHODS OF FORMING A THIN FERROELECTRIC LAYER AND METHODS OF MANUFACTURING A SEMICONDUCTOR DEVICE INCLUDING THE SAME

(75) Inventors: Suk-Hun Choi, Gyeonggi-do (KR); Jong-Won Lee, Gyeonggi-do (KR); Chang-Ki Hong, Gyeonggi-do (KR); Bo-Un Yoon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 356 days.

(21) Appl. No.: 12/503,440

(22) Filed: Jul. 15, 2009

(65) Prior Publication Data

US 2010/0015729 A1 Jan. 21, 2010

(30) Foreign Application Priority Data

Jul. 17, 2008 (KR) .................. 10-2008-0069681

(51) Int. Cl.
*H01L 21/4763* (2006.01)

(52) U.S. Cl. ........ 438/633; 438/691; 438/692; 438/693; 257/E27.104; 257/E21.208

(58) Field of Classification Search .................. 438/633, 438/691, 693; 257/E27.104, E21.208
See application file for complete search history.

(56) References Cited

U.S. PATENT DOCUMENTS

| 6,339,008 | B1 * | 1/2002 | Takenaka ................. 438/396 |
| 6,626,968 | B2 * | 9/2003 | Park et al. ................. 51/309 |
| 6,790,678 | B2 | 9/2004 | Song et al. |
| 2003/0175998 | A1 * | 9/2003 | Nagano et al. ............ 438/3 |
| 2005/0147018 | A1 * | 7/2005 | Kim et al. ................. 369/126 |

FOREIGN PATENT DOCUMENTS

| JP | 2004-214601 A | 7/2004 |
| KR | 2001-0089510 A | 10/2001 |
| KR | 2001-0106658 A | 12/2001 |
| KR | 2002-0007607 A | 1/2002 |
| WO | WO 00/31794 A1 | 6/2000 |

* cited by examiner

*Primary Examiner* — Bradley K Smith
*Assistant Examiner* — Amar Movva
(74) *Attorney, Agent, or Firm* — Myers Bigel Sibley & Sajovec, P.A.

(57) ABSTRACT

In methods of forming a thin ferroelectric layer and methods of manufacturing a semiconductor device, a preliminary ferroelectric layer is formed on a substrate by depositing a metal oxide including lead, zirconium and titanium. The surface of the preliminary ferroelectric layer is polished using a slurry composition including an acrylic acid polymer, abrasive particles, and water to form a thin ferroelectric layer on the substrate. The slurry composition may reduce a polishing rate of the preliminary ferroelectric layer such that removal of a bulk portion of the preliminary ferroelectric layer may be suppressed and the surface roughness of the preliminary ferroelectric layer may be improved.

16 Claims, 16 Drawing Sheets

US 8,124,526 B2

METHODS OF FORMING A THIN FERROELECTRIC LAYER AND METHODS OF MANUFACTURING A SEMICONDUCTOR DEVICE INCLUDING THE SAME

CROSS REFERENCE TO RELATED APPLICATION

This application claims priority under 35 USC §119 to Korean Patent Application No. 10-2008-0069681, filed on Jul. 17, 2008 in the Korean Intellectual Property Office (KIPO), the contents of which are herein incorporated by reference in their entirety.

BACKGROUND

1. Field

The present invention relates to methods of forming semiconductor structures and related manufacturing of semiconductor devices. Some embodiments more particularly relate to methods of forming a thin ferroelectric layer using a polishing process and to methods of manufacturing related semiconductor devices.

2. Description of the Related Art

Since the discovery of ferroelectric materials (e.g., PZT ($PbTiO_3$) or SBT ($SiBi_2Ta_2O_9$)), research into their use in memory devices and other electronic devices has been of interest. The ferroelectric material has non-volatile characteristics for storing data in the presence or lack of an electrical charge, due to its electrically controllable polarization state.

A ferroelectric random access memory (FRAM) device is an example of a memory device that uses ferroelectric materials. The FRAM device provides the readable and writable functions of a volatile random access memory while also providing non-volatile characteristics for storing data. Current techniques of manufacturing the FRAM device have some deficiencies as compared with techniques of manufacturing a DRAM device, so operational speed of the FRAM device may be dissatisfactory. However, the FRAM device has non-volatile characteristics that retain data while there is a lack of an electrical charge, so the FRAM device may be very useful as a storage unit that provides nonvolatile retention of information. Relative to some nonvolatile devices, the FRAM device may have lower power usage in operation, faster write performance and a greater maximum number of write-erase cycles.

A memory device using a scanning probe (e.g., a ferroelectric hard disk (FeHDD)) may is another example of a memory device that uses ferroelectric materials. The probe memory device may use a ferroelectric material media for its non-volatile characteristics. The probe memory device using the ferroelectric material may be a scaled down substitute for a conventional hard disk. Accordingly, development of a highly-integrated probe memory device using ferroelectric materials is of considerable interest.

Techniques of forming a ferroelectric layer having properties adequate for a memory device are needed. As the integration degree increases and operational voltage decreases in a memory device, formation of a ferroelectric layer having a reduced size while avoiding deterioration of its electrical polarization properties or other electrical properties may be required to realize more highly-integrated memory devices.

SUMMARY

Some embodiments are directed to methods of forming a thin ferroelectric layer.

Some other embodiments are directed to methods of manufacturing a semiconductor device.

According to some embodiments, a method of forming a thin ferroelectric layer is provided in which a preliminary ferroelectric layer may be formed on a substrate. A surface of the preliminary ferroelectric layer may be polished using a slurry composition that includes an acrylic acid polymer, abrasive particles, and water to form a thin ferroelectric layer on the substrate.

In some embodiments, the preliminary ferroelectric layer may be formed by a metal organic chemical vapor deposition process.

In some embodiments, the preliminary ferroelectric layer may be formed using a metal oxide including lead, zirconium and titanium.

In some embodiments, the surface of the preliminary ferroelectric layer may be polished by planarizing a surface of the preliminary ferroelectric layer while suppressing removal of a bulk portion of the preliminary ferroelectric layer.

In some embodiments, the surface of the preliminary ferroelectric layer may be polished using the slurry composition including the acrylic acid polymer in an amount ranging from about 0.01 to about 1.0 wt %, or in an amount ranging from about 0.08 to about 0.12 wt %.

In some embodiments, the surface of the preliminary ferroelectric layer may be polished using the slurry composition including ceria or cerium oxide abrasive particles.

In some embodiments, an insulation layer may be formed on the preliminary ferroelectric layer, and a polishing process may be performed on the insulation layer using the slurry composition to remove the insulation layer from the preliminary ferroelectric layer. The polishing process may be performed using the preliminary ferroelectric layer as a polishing stop layer until the preliminary ferroelectric layer is exposed. Polishing the surface of the preliminary ferroelectric layer may be performed by a polishing process substantially the same as the polishing process for removing the insulation layer.

In some embodiments, a polishing selectivity of the insulation layer to the preliminary ferroelectric layer may be in range of about 20:1 to about 100:1.

In some embodiments, polishing the surface of the preliminary ferroelectric layer may be performed using a chemical mechanical polishing apparatus that includes a carrier for mounting the substrate and a polishing pad contacting the surface of the preliminary ferroelectric layer. The substrate and the polishing pad may be pressed together with a pressure that is in a range of about 1 to about 5 psi, and a rotation speed of the polishing pad may be in a range of about 10 to about 120 rpm.

In some embodiments, the thin ferroelectric layer may have an RMS value in a range of about 1 Å to about 10 Å, and a P-V value in a range of about 10 Å to about 100 Å.

According to some other embodiments, a method of manufacturing a semiconductor device is provided that includes forming a lower electrode on a substrate. A preliminary ferroelectric layer may be on the lower electrode, and then a surface of the preliminary ferroelectric layer may be polished using a slurry composition including an acrylic acid polymer, abrasive particles, and water to form a thin ferroelectric layer on the lower electrode. An upper electrode may be formed on the thin ferroelectric layer.

According to still some other embodiments, a method of manufacturing a semiconductor device is provided that includes forming an electrode on a substrate. A preliminary ferroelectric layer may be formed on the electrode, and a surface of the preliminary ferroelectric layer may be polished using a slurry composition including an acrylic acid polymer, abrasive particles, and water to form a thin ferroelectric layer on the electrode. A barrier layer may be formed on the thin ferroelectric layer, and a semiconductor layer may be formed on the barrier layer. A probe may be disposed on the semiconductor layer.

According to some embodiments, a ferroelectric layer may be polished with a reduced polishing rate using a slurry composition including an acrylic acid polymer. Even though a polishing pressure and a rotational speed of a polishing pad are not substantially reduced, removal of a bulk portion of the ferroelectric layer may be suppressed and a rough surface portion of the ferroelectric layer may be selectively planarized. Therefore, a polishing efficiency may be maintained, and deterioration of ferroelectric characteristics caused by a thickness decrease may also be reduced. Further, the acrylic acid polymer may hold a rapid polishing rate of an insulation layer, and may selectively reduce a polishing rate of a ferroelectric layer. Thus, a polishing selectivity of the insulation layer relative to the ferroelectric layer may be greatly enhanced. By using the slurry composition having such a high polishing selectivity, the insulation layer may be rapidly polished or removed while suppressing excessive removal the ferroelectric layer provided as a polishing stop layer.

The ferroelectric layer formed by the polishing process may have greatly improved surface roughness. Thus, deterioration of data retention and/or polarization retention may be suppressed at a relatively thin thickness, and generation of a leakage current may be reduced. Accordingly, electrical characteristics of a FRAM device including the ferroelectric layer may be largely enhanced. Further, a probe memory device having improved durability and electrical characteristics may be obtained.

BRIEF DESCRIPTION OF THE DRAWINGS

Example embodiments will be more clearly understood from the following detailed description taken in conjunction with the accompanying drawings.

FIG. 1 is a flow chart illustrating methods of forming a thin ferroelectric layer in accordance with some embodiments.

FIGS. 2 and 3 are cross-sectional views illustrating methods of forming a thin ferroelectric layer in accordance with some embodiments.

FIGS. 4 and 5 are electronic microscopic pictures showing an upper face and a cross-section of a PZT layer formed on an iridium layer.

FIGS. 6 and 7 are electronic microscopic pictures showing an upper face and a cross-section of a PZT layer formed on an iridium layer, the PZT layer being planarized by a polishing process to improve roughness.

FIGS. 8 and 9 are cross-sectional views illustrating methods of forming a thin ferroelectric layer in accordance with some other embodiments.

FIG. 10 is a graph illustrating polishing rates and a polishing selectivity for a silicon oxide layer and a PZT layer according to variation of an amount of poly(acrylic acid, sodium salt).

FIGS. 11 and 12 are graphs illustrating curves of polarization vs. applied voltage and curves of 2 Pr vs. applied voltage according to variation of an amount of poly(acrylic acid, sodium salt), respectively.

FIGS. 13 through 17 are cross-sectional views illustrating methods of manufacturing a ferroelectric capacitor including a thin ferroelectric layer in accordance with some embodiments.

FIGS. 18 through 20 are cross-sectional views illustrating methods of manufacturing a ferroelectric capacitor including a thin ferroelectric layer in accordance with some other embodiments.

FIGS. 21 through 25 are cross-sectional views illustrating methods of manufacturing a semiconductor device including a thin ferroelectric layer in accordance with some embodiments.

FIGS. 26 through 28 are cross-sectional views illustrating methods of manufacturing a semiconductor device including a thin ferroelectric layer in accordance with some other embodiments.

DETAILED DESCRIPTION OF EXAMPLE EMBODIMENTS

Figure 1:
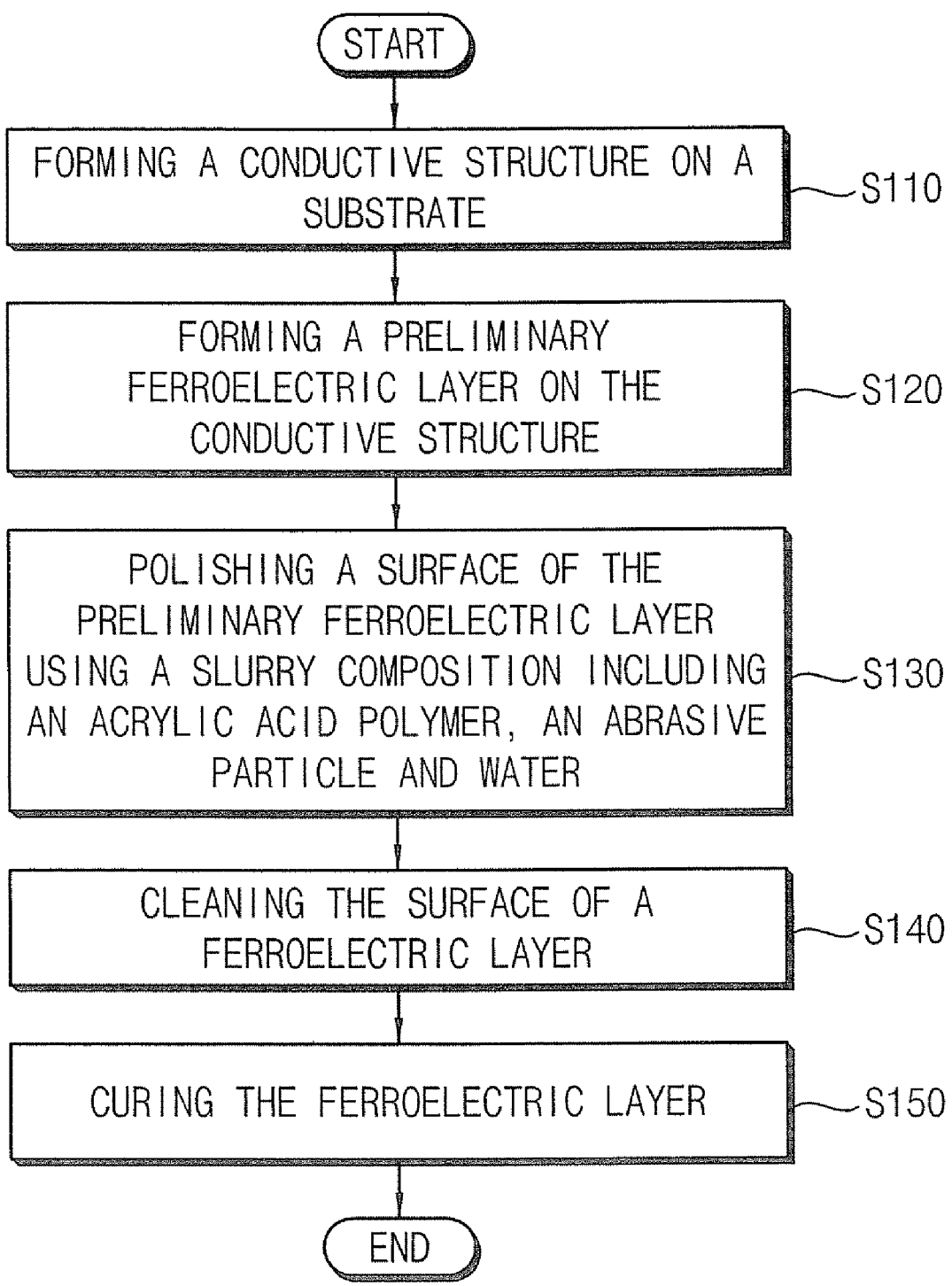
FIGS. 1-28 represent non-limiting, example embodiments as described herein.

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms including technical and scientific terms used herein have the same meaning as commonly understood by one of ordinary skill in the art to which example embodiments belongs. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 2:
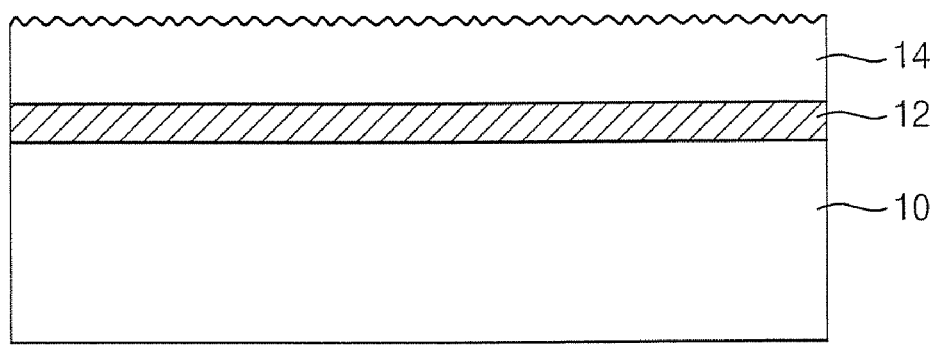
Figure 3:
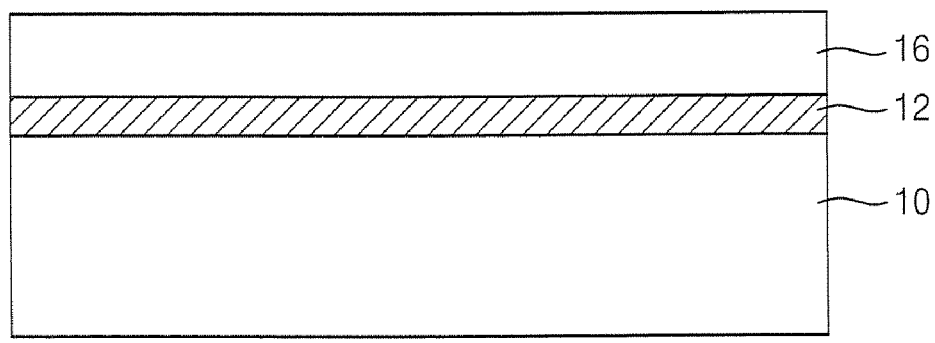

FIG. 1 is a flow chart illustrating methods of forming a thin ferroelectric layer in accordance with example embodiments. FIGS. 2 and 3 are cross-sectional views illustrating methods of forming a thin ferroelectric layer in accordance with example embodiments.

Referring to FIGS. 1 and 2, a conductive structure 12 may be formed on a substrate 10 (S110). In example embodiments, the substrate 10 may be a semiconductor substrate (e.g., a silicon wafer, an SOI substrate, etc.). In other example embodiments, the substrate 10 may be a single crystalline metal oxide substrate. For example, the substrate 10 may include a single crystalline aluminum oxide ($Al_2O_3$) substrate, a single crystalline strontium titanium oxide ($SrTiO_3$) substrate, or a single crystalline magnesium oxide (MgO) substrate. When the substrate 10 includes the single crystalline metal oxide substrate, a thin ferroelectric layer 16 may be directly formed on the substrate 10 without a formation of the conductive structure 12.

The conductive structure 12 may include a first conductive layer (not illustrated) and a second conductive layer (not illustrated) sequentially formed on the substrate 10. The first conductive layer may serve as a barrier layer that prevents oxygen included in the thin ferroelectric layer 16 from diffusing to the conductive structure 12 and the substrate 100. The second conductive layer may enhance a crystallization of ingredients contained in the thin ferroelectric layer 16.

The first conductive layer may be formed using a metal nitride. For example, the first conductive layer may be formed using titanium aluminum nitride (TiAlN), aluminum nitride (AlN), titanium nitride (TiN), titanium silicon nitride (TiSiN), tantalum nitride (TaN), tantalum silicon nitride (TaSiN), tungsten nitride (WN), etc. The first conductive layer may be formed on the substrate 10 by a sputtering process, a chemical vapor deposition (CVD) process or an atomic layer deposition (ALD) process, etc. For example, the first conductive layer may be formed using titanium aluminum nitride by the sputtering process.

The second conductive layer may be formed using a metal (e.g., iridium (Ir), platinum (Pt), ruthenium (Ru) or an alloy of iridium-ruthenium ($Ir_xRu_{1-x}$)), or a metal oxide (e.g., iridium oxide ($IrO_2$) or ruthenium oxide ($RuO_3$). In other example embodiments, the second conductive layer may be a double layer including a metal oxide layer and a metal layer. For example, the second conductive layer may be a double layer of a strontium-ruthenium oxide (SRO) layer and an iridium layer, or a double layer of an iridium oxide ($IrO_2$) layer and an iridium layer. The second conductive layer may be formed by a sputtering process, a CVD process, a pulse laser deposition (PLD) process or an ALD process.

When the conductive structure 12 includes a metal oxide, the substrate, on which the conductive structure 12 is formed, may be thermally treated to improve crystallinity of the conductive structure 12. For example, the thermal treatment may be performed at a temperature of about 500~700° C. under oxygen and nitrogen atmosphere.

In other example embodiments, an insulation layer (not illustrated) may be formed on the substrate 10 prior forming the conductive structure 12 on the substrate 10. The insulation layer may be formed using an oxide (e.g., BPSG, PSG, USG, SOG, FOX, PE-TEOS or HDP-CVD oxide). The insulation layer may be formed by a CVD process, a plasma-enhanced CVD (PE-CVD) process, an ALD process or a high density plasma-chemical vapor deposition (HDP-CVD) process.

In some embodiments, an adhesion layer may be formed between the insulation layer and the conductive structure 12. The adhesion layer may improve an adhesive strength between the insulation layer and the conductive structure 12. The adhesion layer may be formed using a metal or a conductive metal nitride. For example, the adhesion layer is formed using titanium (Ti), titanium nitride (TiN), tantalum (Ta), tantalum nitride (TaN), aluminum (Al), aluminum nitride (AlN), tungsten (W), tungsten nitride (WN), etc. The adhesion layer may be formed on the insulation layer by a sputtering process, a CVD process, a PLD process, an ALD process, etc.

In some embodiments, the first conductive layer of the conductive structure 12 may increase the adhesion strength between the substrate 10 and the second conductive layer when the adhesion layer is not formed between the substrate 10 and the conductive structure 12. That is, the first conductive layer may simultaneously serve as the adhesion layer and the barrier layer.

Referring to FIGS. 1 and 2, a preliminary ferroelectric layer 14 may be formed on the conductive structure 12 (S120).

In some embodiments, the preliminary ferroelectric layer 14 may include a ferroelectric material such as one ore more of PZT [$Pb(Zr, Ti)O_3$], SBT ($SrBi_2Ta_2O_9$), BLT [$(Bi, La)TiO_3$], PLZT [$Pb(La, Zr)TiO_3$], BST [$(Bi, Sr)TiO_3$], etc. In some other embodiments, the preliminary ferroelectric layer 14 may include the ferroelectric material doped with impurities. For example, the preliminary ferroelectric layer 14 may include PZT, SBT, BLT, PLZT and/or BST doped with calcium (Ca), lanthanum (La), manganese (Mn) and/or bismuth (Bi). In still other example embodiments, the preliminary ferroelectric layer 14 may include one or more metal oxides such as titanium oxide ($TiO_2$), tantalum oxide ($TaO_2$), aluminum oxide ($Al_2O_3$), zinc oxide ($ZnO_2$), hafnium oxide ($HfO_2$), etc.

The preliminary ferroelectric layer 14 may be formed on the conductive layer 12 by a metal organic chemical vapor deposition (MOCVD) process, a sol-gel process and/or an ALD process. For example, the preliminary ferroelectric layer 14 may be formed using PZT by the MOCVD process. The formation of the preliminary ferroelectric layer 14 will be described in detail as follows:

The substrate 10 having the conductive structure 12 may be loaded on a susceptor installed in a reaction chamber. While forming the preliminary ferroelectric layer 14, the substrate 10 may be maintained at a temperature of about 350 to about 650° C., and the reaction chamber may be maintained at a pressure of about 1 to about 10 Torr. A metal organic precursor may be provided onto the substrate 10 together with a carrier gas.

The metal organic precursor may include a first compound containing lead, a second compound containing zirconium, and a third compound containing titanium. Alternatively, the metal organic precursor may include a compound containing lead, zirconium and titanium. The carrier gas may include a nitrogen ($N_2$) gas, a helium (He) gas and/or an argon (Ar) gas.

In the meantime, an oxidant may be provided into the reaction chamber. The oxidant may include oxygen ($O_2$), ozone ($O_3$), nitrogen dioxide ($NO_2$) and/or nitrous oxide ($N_2O$). As the metal organic precursor and the oxidant react with each other, the preliminary ferroelectric layer 14 may be formed on the conductive structure 12. Here, the preliminary ferroelectric layer 14 may include PZT formed by the MOCVD process.

A surface of the preliminary ferroelectric layer 14 may have a relatively large roughness, when the preliminary ferroelectric layer 14 is formed using PZT by the MOCVD process. For example, the surface of the preliminary ferroelectric layer 14 including PZT may have a first root mean square (RMS) value of about 30 to about 80 Å, and a first peak-to-valley value (referred to as P-V value) of about 200 to about 600 Å.

Figure 4:
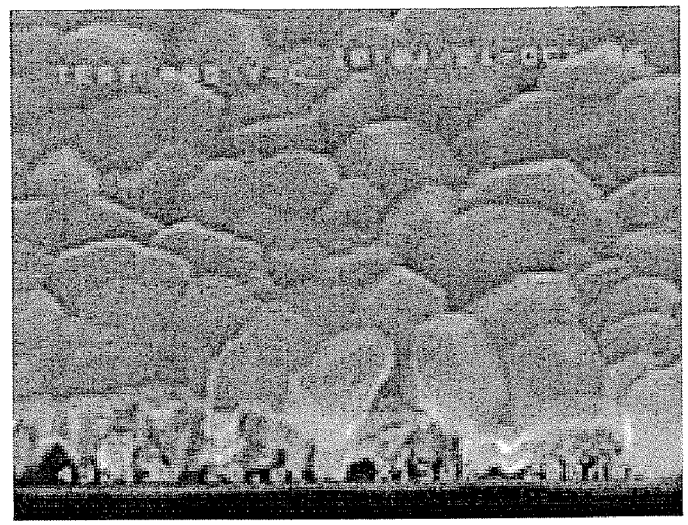
Figure 5:
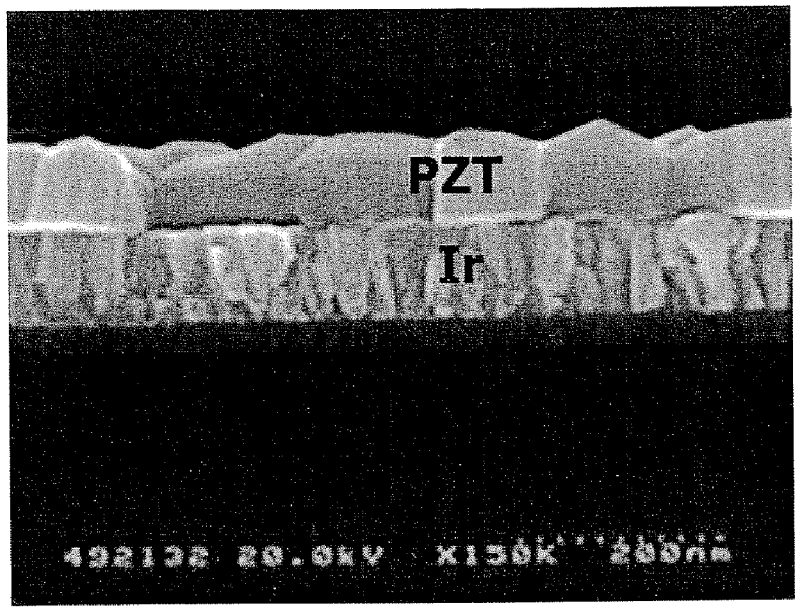

FIG. 4 is an electronic microscopic picture showing an upper face of a PZT layer formed on an iridium layer, and FIG. 5 is an electronic microscopic picture showing a cross-section of the PZT layer formed on the iridium layer. As illustrated in FIGS. 4 and 5, a PZT layer formed on an iridium layer by an MOCVD process may have a large surface roughness. The measured first RMS value was about 33 Å, and the first P-V value was about 263 Å.

When a ferroelectric layer has the relatively large RMS value and the P-V value, the ferroelectric layer may have reduced data retention and/or polarization retention, and a generation of leakage current from the ferroelectric layer may increase. Further, when a ferroelectric capacitor includes a very thin ferroelectric layer having a thickness of about 40 nm or less, the large P-V value of the surface may be a big obstacle in the formation of the ferroelectric capacitor.

Additionally, when a probe memory device is formed using a ferroelectric layer, a semiconductor layer formed on the ferroelectric layer may have a large surface roughness as well. In such case, a tip of a probe contacting the semiconductor layer for reading, writing and erasing may be readily worn away or broken down. When the surface roughness is severe, the probe can hardly slide on the semiconductor layer.

Accordingly, the surface of the preliminary ferroelectric layer 14 may be polished to provide the thin ferroelectric layer 16 with improved surface characteristics.

Referring to FIGS. 1 and 3, the surface of the preliminary ferroelectric layer 14 may be polished using a slurry composition (S130). By polishing the preliminary ferroelectric layer 14, the thin ferroelectric layer 16 having a planarized surface may be formed on the conductive structure 12.

In some embodiments, the slurry composition employed in polishing the preliminary ferroelectric layer may include an acrylic acid polymer, abrasive particles, and water. The acrylic acid polymer may reduce a polishing rate of a ferroelectric layer. The acrylic acid polymer may also selectively reduce a polishing rate of a ferroelectric layer with respect to a polishing rate of an insulation layer, such that a polishing selectivity of an insulation layer relative to a ferroelectric layer may be improved.

Examples of the acrylic acid polymer that may be used in the slurry composition may include one or more of poly(acrylic acid), poly(acrylic acid-co-maleic acid), poly(acrylic acid-co-acrylamide), salts thereof, and so on. Examples of a salt of poly(acrylic acid) may include poly(acrylic acid, sodium salt), poly(acrylic acid, potassium salt), poly(acrylic acid, ammonium salt), etc. In example embodiments, the acrylic acid polymer may have a weight-average molecular weight of about 1,000 to about 1,000,000.

In some embodiments, an amount of the acrylic acid polymer may be in a range from about 0.01 to about 2 wt %, based on a total weight of the slurry composition. In some other embodiments, the amount of the acrylic acid polymer may be in a range of about 0.01 to about 1 wt %. In still some other embodiments, the amount of the acrylic acid polymer may be in a range from about 0.08 to about 0.12 wt %.

Examples of the abrasive particles that may be used in the slurry composition may include ceria (cerium oxide), silica (silicon dioxide), alumina (aluminum oxide), zirconium, zirconium oxide, titania (titanium dioxide), etc. These may be used alone or in a combination thereof. The abrasive particles may have an average diameter in a range of about 5 nm to about 1,000 nm, or about 10 nm to about 500 nm. In some embodiments, an amount of the abrasive particles may be in a range of about 0.1 to about 10 wt %, or in a range of about 1 to about 7 wt %.

In some embodiments, the surface of the preliminary ferroelectric layer 14 may be polished using a slurry composition including ceria abrasive particles. Under the same polishing pressure and rotational speed, the ceria abrasive particles may polish a surface of a ferroelectric layer with a low polishing rate, as compared with using silica abrasive particles. Accordingly, the ceria abrasive particles may suppress polishing a bulk portion of the preliminary ferroelectric layer 14 in a relatively high speed and high pressure polishing, so a polishing efficiency and productivity may be improved.

In example embodiments, the slurry composition may optionally include a dispersing agent, a pH-controlling agent, a surfactant and/or other additives.

In one embodiment, the slurry composition may include a carboxylic acid compound as a dispersing agent. Examples of the carboxylic acid may include one or more of citric acid, malonic acid, acetic acid, glutaric acid, glycolic acid, formic acid, lactic acid, malic acid, maleic acid, oxalic acid, phthalic acid, succinic acid, tartaric acid, etc.

In some other embodiments, the slurry composition may include a pH-controlling agent of an acid or a base to improve a polishing rate and/or a polishing selectivity. Examples of an acidic pH-controlling agent may include an inorganic acid (e.g., sulfuric acid, hydrochloric acid, nitric acid, phosphoric acid, etc.) or an organic acid (e.g., acetic acid, citric acid, etc.) Examples of a basic pH-controlling agent may include one or more of sodium hydroxide, potassium hydroxide, ammonium hydroxide, a quaternary organic ammonium or a salt thereof, etc. The amount of the pH-controlling agent may be properly changed to obtain a predetermined final pH. For example, the slurry composition may have a pH of about 5 to about 8.

In some embodiments, the slurry composition may include a surfactant. Examples of the surfactant may include a cationic surfactant, an anionic surfactant, a non-ionic surfactant or combinations thereof. Examples of the cationic surfactant may include one or more of cetyltrimethylammonium bromide, hexadecytrimethylammonium bromide, cetylpyridinium chloride, etc. Examples of the anionic surfactant may include one or more of sodium dodecyl sulfate, ammonium lauryl sulfate, fatty acid salt, etc. Examples of the non-ionic surfactant may include one or more of alkyl poly(ethylene oxide), alkyl poly(propylene oxide), a copolymer of poly (ethylene oxide) and poly(propylene oxide), etc. The amount of the surfactant may be in a range of about 0.001 to about 10 wt %.

The polishing process of the preliminary ferroelectric layer 14 using the slurry composition will be described in detail below.

The surface of the preliminary ferroelectric layer 14 may be polished using a chemical mechanical polishing (CMP) apparatus that includes a rotational table on which the polishing pad may be located, a rotational axis, a carrier for holding the substrate 10, and a conditioning pad for improving a surface of the polishing pad.

The carrier may be arranged over a portion of the rotational table, and the conditioning pad may be arranged over other portion of the rotational table. The substrate 10 having the preliminary ferroelectric layer 14 to be polished may be mounted on the carrier such that a rough surface of the preliminary ferroelectric layer 14 may face the polishing pad downwards. The substrate 10 located on the carrier may be arranged to make contact with the polishing pad on the rotational table. The carrier holding the substrate 10 may rotate in the same direction as that of the rotational axis. Rotational speeds of the carrier and the rotational axis may be different from each other.

The slurry composition may be provided from a providing nozzle located over the rotational table toward a center portion of the polishing pad. The slurry composition dropped on the polishing pad may move toward an edge portion of the polishing pad due to the centrifugal force. Accordingly, the slurry composition may be provided between the polishing pad and the preliminary ferroelectric layer 14.

In a CMP process for polishing the preliminary ferroelectric layer 14 using the slurry composition, a down pressure applied to the substrate from the carrier (i.e., a pressure for a polishing pad to press the substrate 10) may be a process parameter of affecting a polishing rate of the preliminary ferroelectric layer 14. In example embodiments, the down pressure pressing the substrate 10 may be in a range of about 1 to about 5 psi, and the polishing pad may rotate at a speed of about 10 to about 120 rpm.

While the surface of the preliminary ferroelectric layer 14 is polished, the acrylic acid polymer may reduce the polishing rate of the preliminary ferroelectric layer 14. Accordingly, even though the pressure between the substrate 10 and the polishing pad and the rotational speed of the polishing pad do not substantially decrease, the surface portion of the preliminary ferroelectric layer 14 may be selectively polished and polishing or removing of a bulk portion of the preliminary ferroelectric layer 14 may be suppressed in the polishing process. Therefore, a polishing efficiency may not be substantially reduced, and also deterioration of an electrical polarization of the thin ferroelectric layer 16 caused by a thickness decrease may be prevented.

By performing the polishing process on the preliminary ferroelectric layer 14, the thin ferroelectric layer 16 may be formed on the conductive structure 12 to have the improved surface roughness and flatness. For example, the surface of the thin ferroelectric layer 16 may have a second root mean square (RMS) value of about 1 to about 10 Å, and a second P-V value of about 10 to about 100 Å. As the thin ferroelectric layer 16 is formed to have the improved surface conditions, the ferroelectricity of the thin ferroelectric layer 16 and electrical characteristics of a memory device may be greatly enhanced. Additionally, the thin ferroelectric layer 16 having the improved surface roughness may be employed in a probe memory device to enhance the durability of the probe memory device, because the probe may smoothly slide on a media to reduce the abrasion of the probe.

Figure 6:
Figure 7:
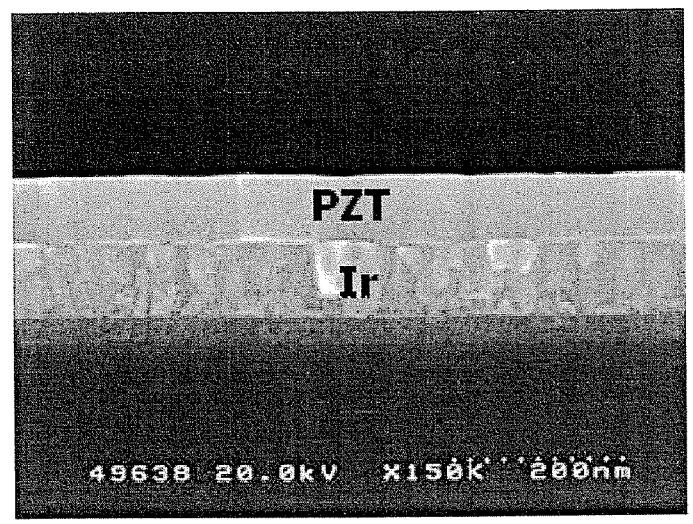

FIG. 6 is an electronic microscopic picture showing an upper face of a PZT layer formed on an iridium layer, the PZT layer being planarized by the polishing process to improve roughness, and FIG. 7 is an electronic microscopic picture showing a cross-section of a PZT layer formed on an iridium layer, the PZT layer being planarized by a polishing process to improve roughness. As illustrated in FIGS. 6 and 7, the polished PZT layer has a smooth and flat surface. The measured RMS value was about 6 Å, and the P-V value was about 97 Å. These values of the polished PZT layer are a great improvement as compared with the values of the unpolished PZT layer as illustrated in FIGS. 4 and 5.

Referring to FIGS. 1 and 3, the thin ferroelectric layer 16 having the greatly improved surface conditions may be cleaned (S140). After the polishing process, slurry residues and/or polishing residues may remain on the surface of the thin ferroelectric layer 16. Additionally, damage may be generated at the surface of the thin ferroelectric layer 16 in the polishing process. Hence, the thin ferroelectric layer 16 may be cleaned to remove the slurry residues and/or polishing residues from the surface of the thin ferroelectric layer 16, and also to somewhat cure the damage to the surface of the thin ferroelectric layer 16. For example, the cleaning process may be performed for about 30 to about 90 seconds using a cleaning solution. Examples of the cleaning solution may include an ammonia solution, deionized water, an SMC solution, an SMF solution, an SC1 solution, etc.

The thin ferroelectric layer 16 may be cured to remove the damage to the surface of the thin ferroelectric layer 16 generated in the above-described polishing process (S150). The thin ferroelectric layer 16 may be cured by thermally treating the surface of the thin ferroelectric layer 16 at a temperature of about 500 to about 600° C. for about 30 to about 90 seconds. For example, the thin ferroelectric layer 16 is cured by a rapid thermal process (RTP). When the curing process is performed on the thin ferroelectric layer 16, the damage to the thin ferroelectric layer 16 generated in the polishing process may be cured. The curing process may be carried out under an inactive gas atmosphere. The inactive gas may include one or more of a nitrogen gas, a helium gas, an argon gas, a xenon gas, a neon gas, etc.

Figure 8:
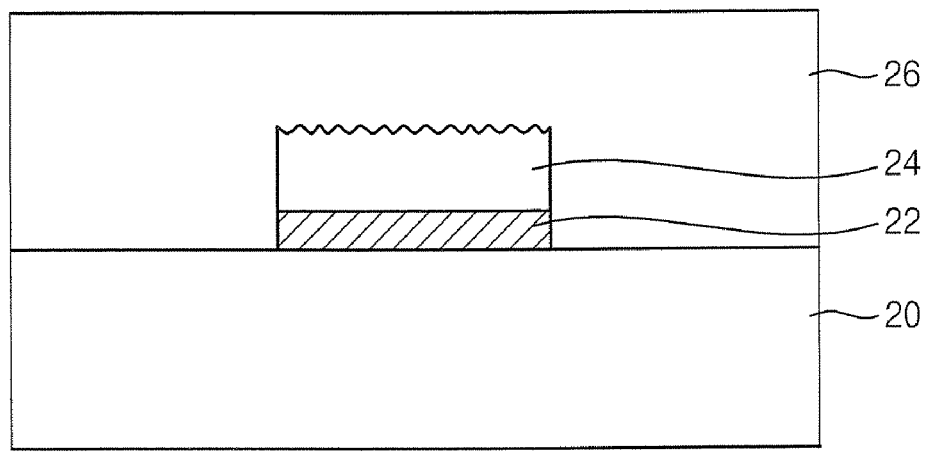
Figure 9:
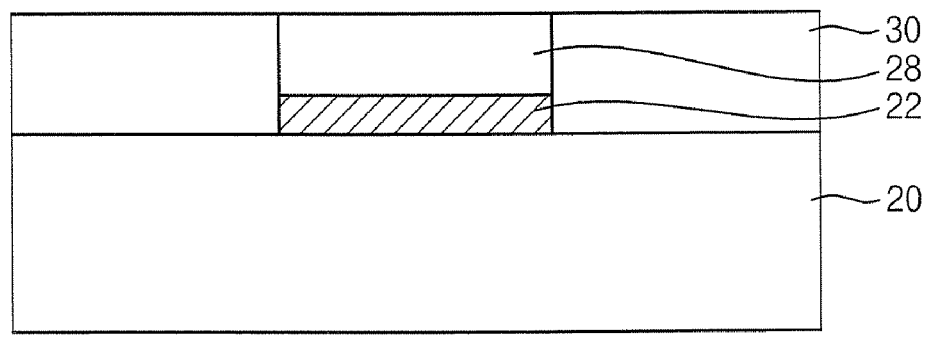

FIGS. 8 and 9 are cross-sectional views illustrating methods of forming a thin ferroelectric layer in accordance with some other embodiments.

Referring to FIG. 8, an insulation layer 26 may be formed on a substrate 20 having a conductive structure 22 and a preliminary ferroelectric layer 24. The formation of the conductive structure 22 and the preliminary ferroelectric layer 24 may be substantially the same as being described with reference to FIG. 2. In some embodiments, the conductive structure 22 and the preliminary ferroelectric layer 24 may be formed to have a pattern shape by performing a film deposition process and a photolithography process.

The insulation layer 26 may be formed on the substrate 20 to cover the conductive structure 22 and the preliminary ferroelectric layer 24. The insulation layer 26 may be formed using an insulation material (e.g., silicon oxide, silicon nitride, silicon oxynitride, etc.) For example, the insulation layer 26 may be formed using silicon oxide (e.g., BPSG, PSG, USG, SOG, FOX, PE-TEOS, HDP-CVD oxide, etc.). The insulation layer 26 may be formed by a CVD process, a PE-CVD process, an ALD process, an HDP-CVD process, etc.

Referring to FIG. 9, a polishing process may be performed on the substrate 20 having the insulation layer 26 and the preliminary ferroelectric layer 26. The polishing process may be performed such that an upper portion of the insulation layer 26 is removed to expose the preliminary ferroelectric layer 24 and the surface of the preliminary ferroelectric layer 26 is polished to have an improved roughness. Accordingly, a thin ferroelectric layer 28 and an insulation layer pattern 30 may be formed on the substrate 20.

The polishing process for removing an upper portion of the insulation layer 26 formed on the preliminary ferroelectric layer 24 and for planarizing the surface of the preliminary ferroelectric layer 24, may be performed using the slurry composition employed in the polishing process described with reference to FIG. 3.

The slurry composition may include an acrylic acid polymer, abrasive particles, and water. The acrylic acid polymer may also selectively reduce a polishing rate of a ferroelectric layer with respect to a polishing rate of an insulation layer, such that a polishing selectivity of an insulation layer relative to a ferroelectric layer may be improved. In other words, the acrylic acid polymer may provide a relatively rapid polishing rate of the insulation layer, whereas the acrylic acid polymer may greatly reduce a polishing rate of the ferroelectric layer. Accordingly, the slurry composition may serve to rapidly and efficiently remove the insulation layer 26, and the surface portion of the preliminary ferroelectric layer 24 may be selectively planarized while suppressing removal of a bulk portion of the preliminary ferroelectric layer 24.

In example embodiments, the preliminary ferroelectric layer 24 may be used as a polishing stop layer in a polishing process performed for removing the insulation layer 26, since the slurry composition may have a polishing rate of the preliminary ferroelectric layer 24 much lower than a polishing rate of the insulation layer 26.

The components included in the slurry composition (e.g., an acrylic acid polymer, an abrasive particle, a pH-controlling agent, a dispersing agent, a surfactant, etc.) may be substantially the same as the components in the slurry composition described with reference to FIG. 3.

In some embodiments, the slurry composition may show a polishing rate of the insulation layer 26 at least about 20 times faster than a polishing rate of the preliminary ferroelectric layer 24. That is, a polishing selectivity of the insulation layer 26 relative to the preliminary ferroelectric layer 24 may be at least about 20:1. In some other embodiments, the polishing selectivity of the insulation layer 26 relative to the preliminary ferroelectric layer 24 may be in a range of about 20:1 to about 100:1. In still some other embodiments, the polishing selectivity of the insulation layer 26 relative to the preliminary ferroelectric layer 24 may be in a range of about 40:1 to about 100:1.

The slurry composition may have a high polishing selectivity of the insulation layer 26 relative to the preliminary ferroelectric layer 24, so the slurry composition may provide a sufficient process margin of the polishing process using the preliminary ferroelectric layer 24 as a polishing stop layer and may also suppress over-polishing or damage of the preliminary ferroelectric layer 24.

In some embodiments, an amount of the acrylic acid polymer may be in a range from about 0.01 to about 1 wt %. In other example embodiments, the amount of the acrylic acid polymer may be in a range from about 0.05 to about 0.5 wt %, or in a range of about 0.08 to about 0.12 wt %.

The thin ferroelectric layer 28 formed by performing the polishing process on the preliminary ferroelectric layer 24 may have a reduced roughness and a flat surface. For example, the thin ferroelectric layer 28 may have a second RMS value of about 1 to about 10 Å, and a second P-V value of about 10 to about 100 Å. The thin ferroelectric layer 28 having the improved surface conditions may reduce a leakage current generated from the thin ferroelectric layer 28, and may have the enhanced electrical polarization characteristics at a relatively thin thickness.

A cleaning process for removing slurry residues and polishing residues from the substrate 20 and the thin ferroelectric layer 28 may be performed. Further, the thin ferroelectric layer 28 may be thermally treated to cure damage existing on its surface. The cleaning process and the curing process may be substantially the same as those described with reference to FIGS. 1 and 3.

Example embodiments for a method of forming a thin ferroelectric layer will be described hereinafter with reference to Examples and Comparative Examples.

Preparation of a Slurry Composition

PREPARATION EXAMPLE 1

A slurry composition was prepared by mixing about 0.1 wt % of poly(acrylic acid, sodium salt) having a weight-average molecular weight of about 100,000, about 5 wt % of ceria abrasive particles and about 94.9 wt % of water. No pH-controlling agent was added to the slurry composition, and the obtained slurry composition had a neutral pH.

PREPARATION EXAMPLES 2 THROUGH 4

Slurry compositions were prepared by the method substantially the same as the method of Preparation Example 1, except the amount of poly(acrylic acid, sodium salt). The amount of poly(acrylic acid, sodium salt was about 0.5 wt % in Preparation Example 2, and the amount of poly(acrylic acid, sodium salt was about 1.0 wt % in Preparation Example 3. In Preparation Example 4, poly(acrylic acid, sodium salt) was not added to the slurry composition.

Formation of a Thin Ferroelectric Layer

EXAMPLE 1

A preliminary ferroelectric layer was formed on a silicon wafer by depositing PZT through an MOCVD process to have a thickness of about 1,000 Å. A chemical mechanical polishing (CMP) process was performed on the preliminary ferroelectric layer using the slurry composition prepared in Preparation Example 1 to form a thin ferroelectric layer. The CMP process was carried out using a wafer polishing equipment provided by Strasbaugh, and IC 1000 stack pad supplied by Rodel in U.S.A. was used as a polishing pad. A pressure of the polishing pad was about 3.0 psi, a down pressure was about 3.0 psi, a rotational speed of a spindle was about 100 rpm, a rotational speed of a table was about 95 rpm, and a flow rate of the slurry composition was about 200 mL/min. After performing the CMP process, the silicon wafer was cleaned using deionized water. As a result, a thin ferroelectric layer having a polished surface was obtained.

EXAMPLES 2 AND 3 AND COMPARATIVE EXAMPLE 1

Thin ferroelectric layers were prepared by the method substantially the same as the method of Example 1 except using slurry compositions having different amounts of poly(acrylic acid, sodium salt). In Examples 2 and 3, the slurry compositions prepared in Preparation Examples 2 and 3 were used, respectively. In Comparative Example 1, the slurry composition including no poly(acrylic acid, sodium salt) prepared in Preparation Example 4 was used.

Evaluation of Polishing Rates of a Ferroelectric Layer and a Silicon Oxide Layer According to Variation of the Amount of an Acrylic Acid Polymer A polishing rate of a ferroelectric layer was analyzed by measuring a thickness change of the ferroelectric layer before and after performing the polishing process in Examples 1 through 3 and Comparative Example 1. Additionally, a polishing rate of an insulation layer was measured. A silicon oxide layer was formed on a silicon wafer by depositing PE-TEOS to have a thickness of about 8,000 Å. A polishing process was performed on the silicon oxide layer using each of the slurry compositions prepared in Preparation Examples 1 through 4, and then a thickness change of the silicon layer was measured to evaluate the polishing rate of the silicon oxide layer. Polishing conditions were substantially the same those of the polishing process for polishing the ferroelectric layer.

Figure 10:
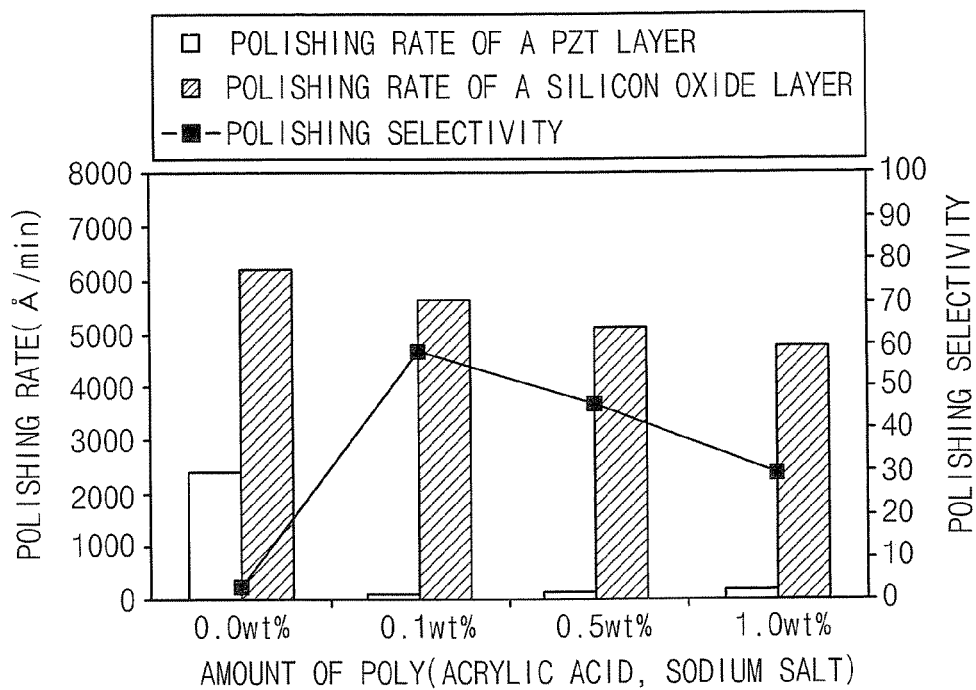

Polishing rates of the ferroelectric layer and the silicon oxide layer are shown in Table 1 and FIG. 10. FIG. 10 is a graph illustrating polishing rates and a polishing selectivity for the silicon oxide layer and the PZT layer according to variation of an amount of poly(acrylic acid, sodium salt) (PAA).

TABLE 1

| Slurry | PAA [wt %] | Polishing rate [Å/min] | | Polishing selectivity (oxide:PZT) |
|---|---|---|---|---|
| | | PZT layer | Silicon oxide layer | |
| Preparation Example 4 | 0.0 | 2,419 | 6,242 | 3:1 |
| Preparation Example 1 | 0.1 | 96 | 5,614 | 59:1 |
| Preparation Example 2 | 0.5 | 112 | 5,140 | 46:1 |
| Preparation Example 3 | 1.0 | 162 | 4,752 | 29:1 |

As shown in Table 1 and FIG. 10, the slurry composition including no PAA exhibited a polishing rate of the PZT layer as being about 2,419 Å/min. The slurry compositions including PAA prepared in Preparation Examples 1 through 3 showed a greatly reduced polishing rate of the PZT layer as being about 162 Å/min or less. When the amount of PAA was about 0.1 wt %, the polishing rate of the PZT layer was the lowest. As the amount of PAA increased from about 0.1 wt % to about 1.0 wt %, the polishing rate of the PZT layer increased about 1.7 times.

As the amount of PAA increased, the polishing rate of the silicon oxide layer decreased. As being compared with the slurry composition including no PAA, the slurry composition including about 1.0 wt % of PAA exhibited the about 24% reduced polishing rate of the silicon oxide layer.

The polishing rate of the silicon oxide layer relative to the PZT layer was evaluated. When the amount of PAA was about 0 wt %, the polishing selectivity was about 3:1 (silicon oxide: PZT). When the amount of PAA was about 0.1 wt %, the polishing selectivity rapidly increased to about 59:1 (silicon oxide: PZT). As the amount of PAA increased from about 0.1 wt % to about 0.5 wt % or about 1.0 wt %, the polishing selectivity gradually decreased. For example, when the amount of PAA was about 1.0 wt %, the polishing selectivity was about 29:1.

Accordingly, it may be noted that an insulation layer (e.g., a silicon oxide layer) may be selectively removed and polishing of a ferroelectric layer may be suppressed when the amount of PAA is ranging from about 0.1 to about 1.0 wt %. Further, adding PAA to a CMP slurry may substantially reduce the polishing rate of the ferroelectric layer. Therefore, the CMP slurry including PAA may reduce polishing of a bulk portion of the ferroelectric layer to inhibit a substantial decrease of a thickness, and may also selectively polish a surface portion of the ferroelectric layer to improve a surface roughness.

Evaluation of Ferroelectric Characteristics of a Ferroelectric Layer According to the Amount Variation of an Acrylic Acid Polymer Ferroelectric characteristics of a ferroelectric layer according to the amount variation of an acrylic acid polymer were evaluated by analyzing a polarization-applied voltage curve and a 2 Pr-applied voltage curve of the thin ferroelectric layers obtained in Examples 1 through 3.

Figure 11:
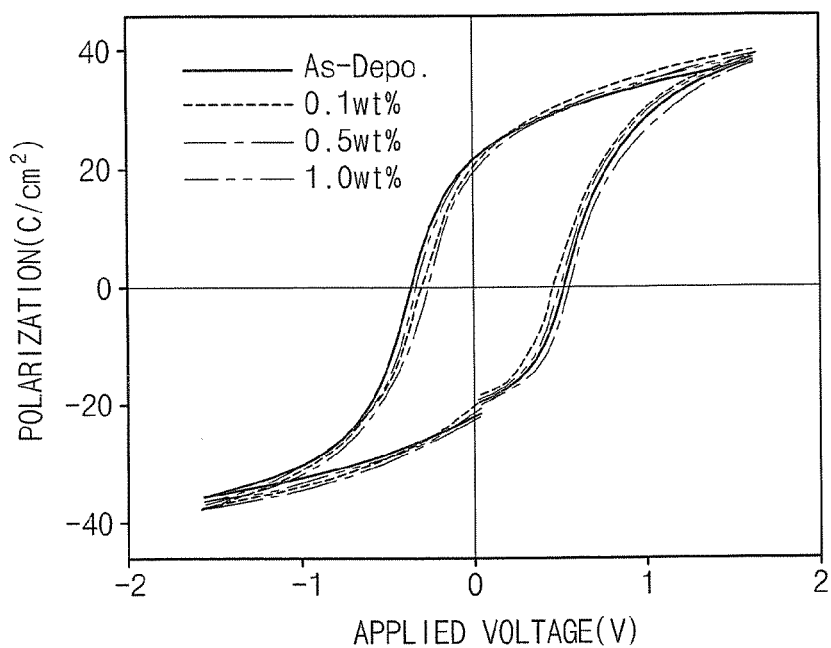
Figure 12:
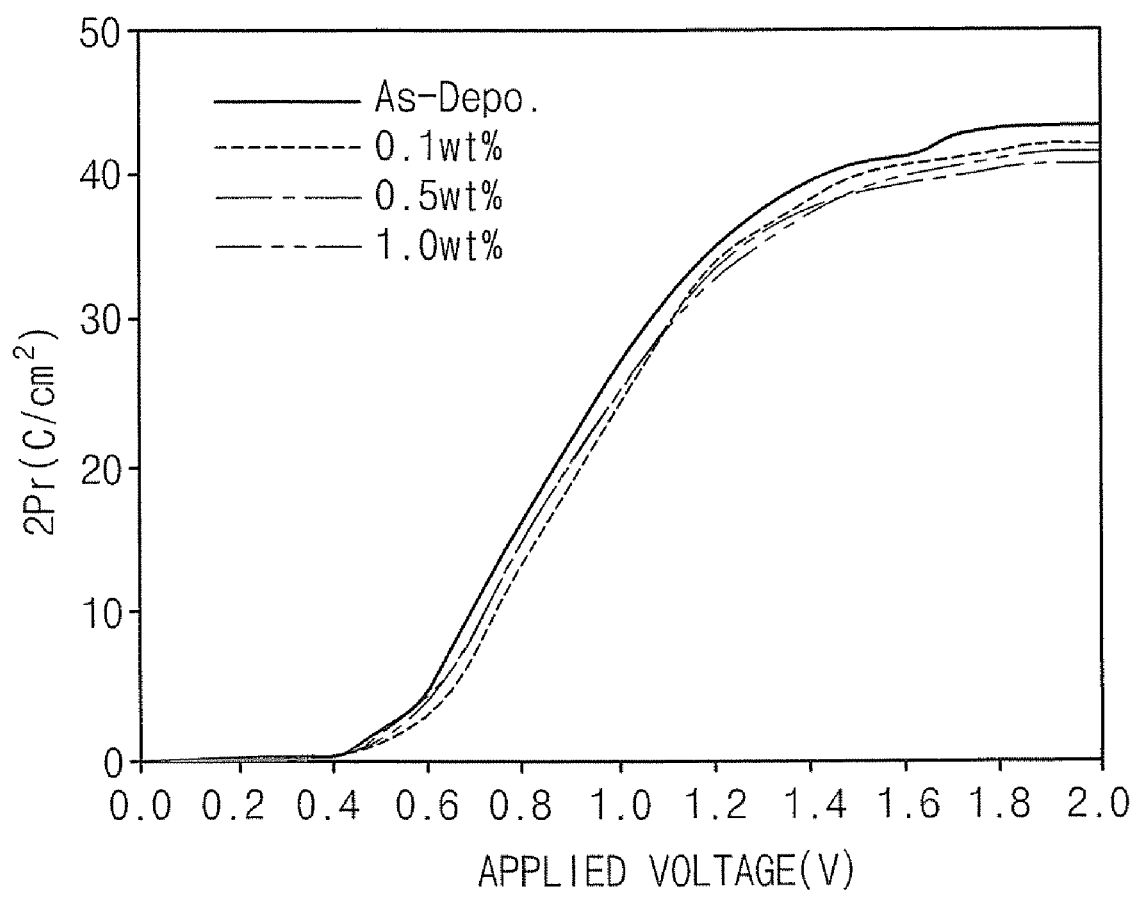

FIG. 11 is a graph illustrating curves of polarization vs. applied voltage of the PZT layer according to variation of an amount of poly(acrylic acid, sodium salt), and FIG. 12 is a graph illustrating curves of 2 Pr vs. applied voltage of the PZT layer according to variation of an amount of poly(acrylic acid, sodium salt).

As shown in FIGS. 11 and 12, it was confirmed that a great change of ferroelectric characteristics was not observed while the amount of PAA increased from about 0.1 wt % to about 1.0 wt %. The thin ferroelectric layer polished using the slurry composition including PAA showed a good electric polarization curve similar to the electric polarization curve (As-Depo) of the unpolished preliminary ferroelectric layer. No large deterioration in the electrical polarization in the polished PZT layer was observed as being compared with the unpolished PZT layer. Accordingly, it may be noted that the polishing process, performed using the slurry composition that includes the acrylic acid polymer, may improve a surface roughness of a ferroelectric layer without causing a substantially decrease in a thickness of the ferroelectric layer or a deterioration of the ferroelectric characteristics.

Evaluation of a Polishing Rate of a Ferroelectric Layer According to a Type of an Abrasive Particle A polishing rate of a ferroelectric layer according to a type of abrasive particles was evaluated by performing a CMP process on a PZT layer using one type of ceria abrasive particles and three types of silica abrasive particles under the same conditions. A pressure of pressing a polishing pad that contacted on the PZT layer was about 1.0 psi, and a rotational speed of the polishing pad was about 10 rpm. A slurry composition including about 5 wt % of ceria abrasive particles supplied by Hitachi Chemical Co. in Japan was used. A CMP silica slurry provided by Bayer Co., and SSW2000 and SS25 manufactured by Cabot was used as the slurry composition including a silica abrasive particle. The measured polishing rates of the PZT layer are shown in Table 2.

TABLE 2

| Abrasive particles | | pH | Polishing rate of a PZT layer [Å/min] |
|---|---|---|---|
| Ceria | | 7.7 | 22 |
| Silica | Bayer | 7.0~8.0 | 89 |
| | SSW2000 | 10.9~11.2 | 191 |
| | SS25 | 2.1~2.5 | 322 |

Referring to Table 2, the silica slurry showed the polishing rate of the PZT layer in a range of about 89 Å/min to about 322 Å/min, whereas the ceria slurry exhibited a low polishing rate of the PZT layer as being about 22 Å/min. Accordingly, it may be noted that the slurry composition including the ceria abrasive particles may greatly reduce the polishing rate of the ferroelectric layer as being compared with using the silica slurry.

Further, when the silica slurry composition is used, neutral slurry (Bayer) may reduce a polishing rate of the PZT layer as being compared with using acidic slurry (SS25) or basic slurry (SSW2000).

FIGS. 13 through 17 are cross-sectional views illustrating methods of manufacturing a ferroelectric capacitor including a thin ferroelectric layer in accordance with some embodiments.

Figure 13:
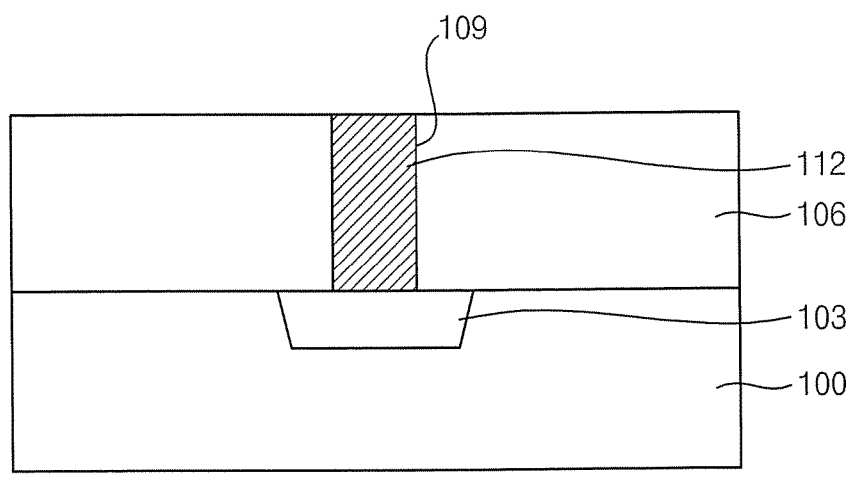

Referring to FIG. 13, a lower structure 103 may be formed on a substrate 100. The substrate 100 may include a semiconductor substrate or a metal oxide substrate. The lower structure 103 may include a contact region, a conductive wiring, a conductive pattern, a pad, a contact, a plug, a gate structure, a transistor, etc.

An insulation structure 106 may be formed on the substrate 100 to cover the lower structure 103. The insulation structure 106 may include at least one insulation layer or an insulation interlayer formed using an oxide such as BPSG, PSG, USG, SOG, FOX, PE-TEOS, HDP-CVD oxide, etc. The insulation structure 106 may include a first insulation layer and a second insulation layer. Here, the first insulation layer may be formed using the oxide, and the second insulation layer may be formed using a nitride such as silicon nitride or an oxynitride such as silicon oxynitride.

The insulation structure 106 may be partially etched to form a hole 109 that partially exposes the lower structure 103. In some embodiments, the hole 109 may be formed by a photolithography process using photoresist.

After a first conductive layer may be formed on the insulation structure 106 to fill up the hole 109, the first conductive layer may be partially removed until the insulation structure 106 is exposed, thereby forming a pad 112 in the hole 109. The pad 112 may be formed using a conductive material such as a metal, a conductive metal nitride or polysilicon doped with impurities. For example, the pad 112 may be formed using tungsten, aluminum, copper, titanium, tungsten nitride, aluminum nitride, titanium nitride, etc. The pad 112 may be formed by partially removing the first conductive layer using a CMP process, an etch back process, or a combination process of CMP and etch back. The pad 112 may electrically connect a lower electrode 136 (see FIG. 15) to the lower structure 103.

Figure 14:
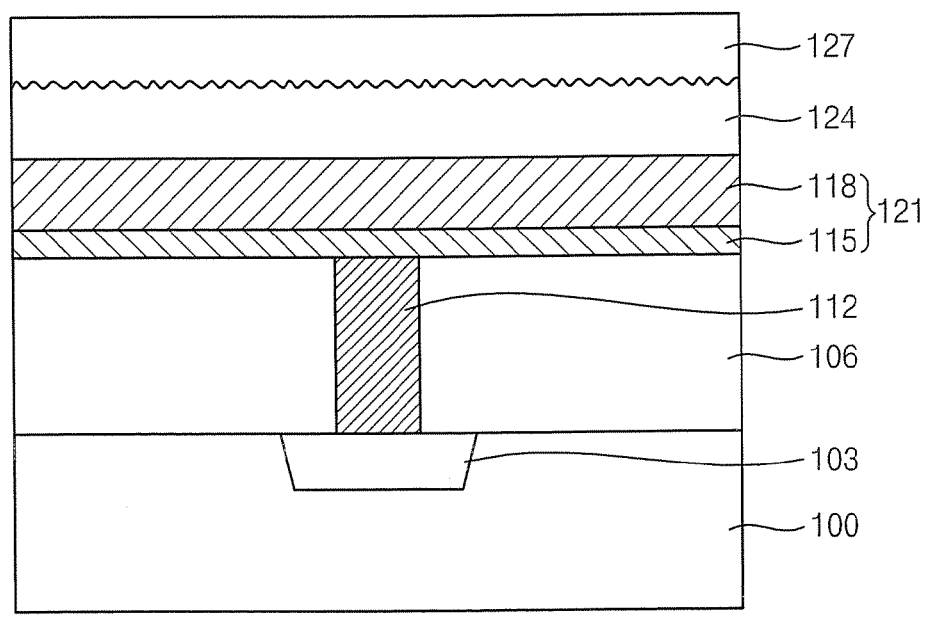

Referring to FIG. 14, a lower electrode layer 121 may be formed on the insulation structure 106 and the pad 112. The lower electrode layer 121 includes a first lower electrode film 115 formed on the pad 112 and the insulation structure 106, and a second lower electrode film 118 formed on the first lower electrode film 115.

The first lower electrode film 115 may be formed using a metal nitride by a sputtering process, a CVD process, a PLD process or an ALD process. For example, the first lower electrode film 115 may be formed using one or more of titanium aluminum nitride, aluminum nitride, titanium nitride, titanium silicon nitride, tantalum nitride, tungsten nitride, tantalum silicon nitride, etc. The second lower electrode film 118 may be formed using a metal such as one or more of ruthenium, iridium, palladium, platinum, gold, etc. The second lower electrode film 118 may be formed using one or more of a sputtering process, a CVD process, an ALD process, a PLD process, etc.

In some embodiments, an adhesion layer may be formed between the insulation structure 106 and the first lower electrode film 115 to improve an adhesive strength between the insulation structure 106 and the first lower electrode film 115. For example, the adhesion layer is formed using one or more of titanium, tantalum, aluminum, tungsten, titanium nitride, tantalum nitride, aluminum nitride, tungsten nitride, etc.

A preliminary ferroelectric layer 124 may be formed on the second lower electrode film 118. The preliminary ferroelectric layer 124 may be formed by depositing a ferroelectric material using an MOCVD process, a sol-gel process and/or a CVD process.

In some embodiments, the preliminary ferroelectric layer 124 may be formed using a ferroelectric material such as PZT, SBT, BLT, PLZT and/or BST. In some other embodiments, the preliminary ferroelectric layer 124 may be formed using a ferroelectric material doped with a metal. For example, the preliminary ferroelectric layer 124 may be formed using one or more of PZT, PLZT, SBT, BLT or BST doped with calcium, lanthanum, manganese and/or bismuth. In still some other embodiments, the preliminary ferroelectric layer 124 may be formed using a metal oxide such as one or more of titanium oxide, tantalum oxide, aluminum oxide, zinc oxide, hafnium oxide, etc.

The preliminary ferroelectric layer 124 including PZT may have a first root mean square (RMS) value of about 30 to about 80 Å, and a first peak-to-valley (P-V) value of about 200 to about 600 Å. The preliminary ferroelectric layer 124 may have a relatively large surface roughness. When the surface of a ferroelectric layer is very rough, data retention or polarization retention of the ferroelectric layer may deteriorate, and a leakage current generated from the ferroelectric layer may increase.

A mask layer 127 may be formed on the preliminary ferroelectric layer 124. The mask layer 127 may be used for patterning the preliminary ferroelectric layer 124 and the lower electrode layer 121. The mask layer 127 may be formed using a material having an etching selectivity relative to the preliminary ferroelectric layer 124 and the lower electrode layer 121. For example, the mask layer 127 may be formed using silicon oxide, silicon nitride or silicon oxynitride.

Figure 15:
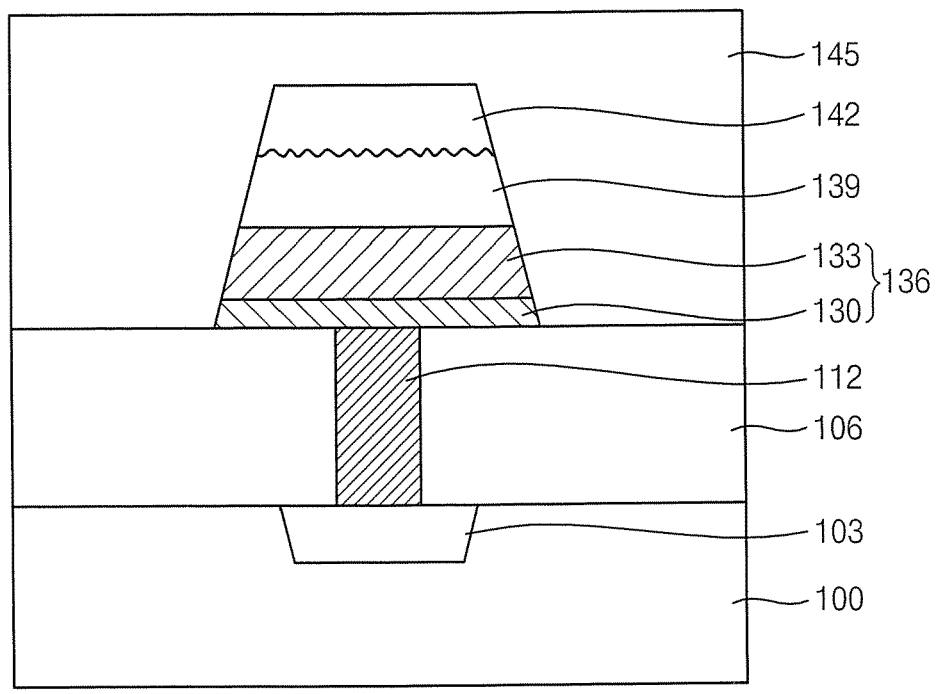

Referring to FIG. 15, a mask layer pattern 142 may be formed on the preliminary ferroelectric layer 124 by performing a photolithography process on the mask layer 127. In some embodiments, a first photoresist pattern (not illustrated) may be formed on the mask layer 127, and then the mark layer 127 may be patterned using the photoresist pattern as an etching mask. After forming the mask layer pattern 142, the photoresist pattern may be removed by an ashing process and/or a stripping process.

The preliminary ferroelectric layer 124 and the lower electrode layer 121 may be sequentially patterned using the mask layer pattern 142 as an etching mask. Accordingly, a preliminary ferroelectric layer pattern 139 and a lower electrode 136 may be sequentially formed on the pad 112 and the insulation structure 106. The lower electrode 136 may include a first lower electrode 130 and a second lower electrode 133 formed on the first lower electrode 130. The first lower electrode 130 may be electrically connected to the lower structure 103 by the pad 112.

An insulation layer 145 may be formed on the insulation structure 106 to cover the mask layer pattern 142, the preliminary ferroelectric layer pattern 139 and the lower electrode 136. The insulation layer 145 may be formed using an insulation material (e.g., silicon oxide, silicon nitride, silicon oxynitride, etc.). For example, the insulation layer 145 may be formed using an oxide (e.g., BPSG, PSG, USG, SOG, FOX, PE-TEOS and/or HDP-CVD oxide). In some embodiments, the insulation layer 145 may be formed using a material substantially the same as that of the mask layer pattern 142. In some other embodiments, the insulation layer 145 may be formed using a material different from that of the mask layer pattern 142.

Figure 16:
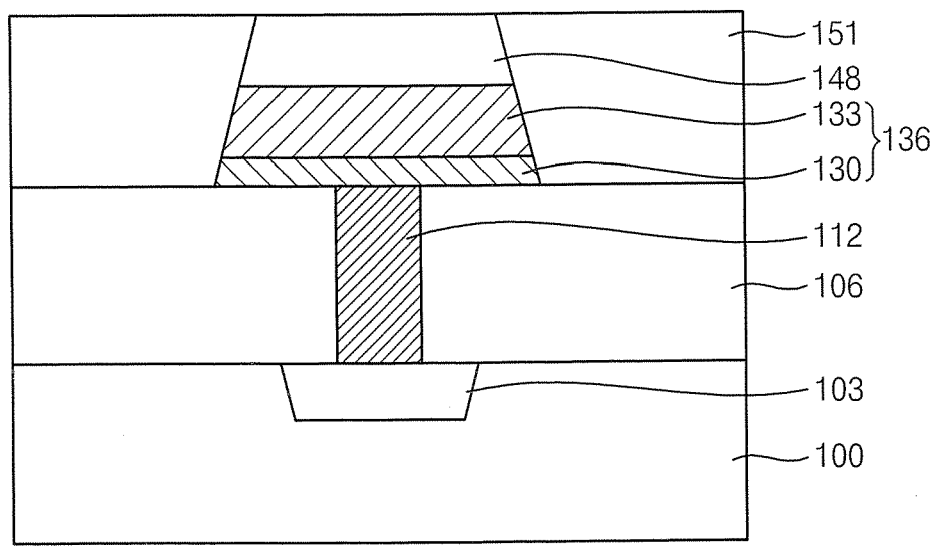

Referring to FIG. 16, a polishing process may be performed on the substrate 100 on which the insulation layer 145, the mask layer pattern 142 and the preliminary ferroelectric layer pattern 139 are formed. By performing the polishing process, the mask layer pattern 142 and an upper portion of the insulation layer 145 may be removed, and a surface of the preliminary ferroelectric layer pattern 139 may be polished. Accordingly, an insulation layer pattern 151 may be formed on the insulation structure 106, and a ferroelectric layer pattern 148 having a greatly improved surface roughness may be formed on the lower electrode 136.

The polishing process may be performed using a slurry composition that includes an acrylic acid polymer, abrasive particles, and water. The acrylic acid polymer may also selectively reduce a polishing rate of a ferroelectric layer with respect to a polishing rate of an insulation layer (e.g., the insulation layer 145 and the mask layer pattern 142), such that a polishing selectivity of the insulation layer relative to a ferroelectric layer may be improved. In other words, the acrylic acid polymer may provide a relatively rapid polishing rate of the insulation layer, whereas the acrylic acid polymer may greatly reduce a polishing rate of the ferroelectric layer.

In some embodiments, a polishing selectivity of an insulation layer (e.g., the insulation layer 145 and the mask layer pattern 142) relative to the preliminary ferroelectric layer pattern 139 may be at least about 20:1. In some other embodiments, the polishing selectivity may be in a range of about 20:1 to about 100:1. In still some other embodiments, the polishing selectivity may be in a range of about 40:1 to about 100:1. The slurry composition may be substantially the same as being described with reference to FIGS. 1 and 3.

In some embodiments, the preliminary ferroelectric layer pattern 139 may be provided as a polishing stop layer in the polishing process for removing the mask layer pattern 142 and the upper portion of the insulation layer 145. In the polishing process, the slurry composition may serve to rapidly and efficiently remove the insulation layer 145 and the mask layer pattern 142, and the surface portion of the preliminary ferroelectric layer pattern 139 may be selectively planarized while suppressing removal of a bulk portion of the preliminary ferroelectric layer pattern 139.

The ferroelectric layer pattern 148 may have a reduced roughness and a flat surface. For example, the ferroelectric layer pattern 148 may have a second RMS value of about 1 to about 10 Å, and a second P-V value of about 10 to about 100 Å. The ferroelectric layer pattern 148 having the improved surface conditions may reduce a leakage current generated from the ferroelectric layer pattern 148, and may also suppress deterioration of a data retention and/or polarization retention at a relatively thin thickness.

After performing the polishing process, a cleaning process for removing slurry residues and polishing residues from the substrate 100, the ferroelectric layer pattern 148 and the insulation layer pattern 151 may be performed. Further, the ferroelectric layer pattern 148 may be thermally treated to cure damage existing on its surface.

Figure 17:
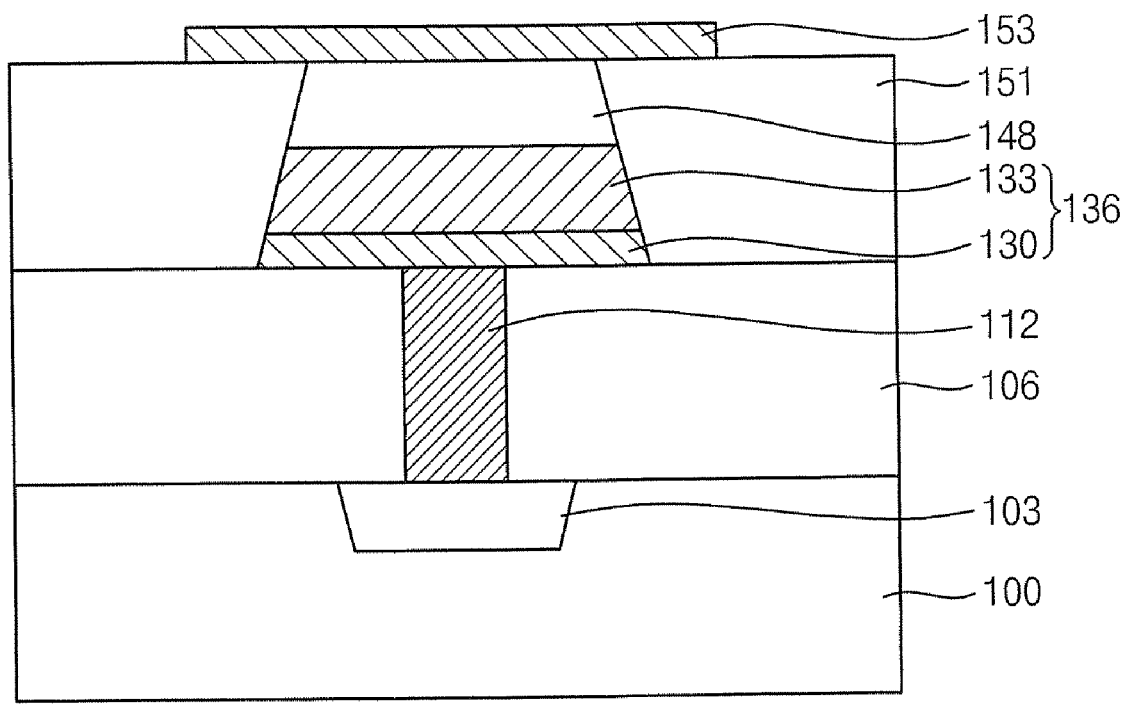

Referring to FIG. 17, an upper electrode layer may be formed on the ferroelectric layer pattern 148 and the insulation layer pattern 151. The upper electrode layer may be formed using a conductive material (e.g., one or more of a metal, doped polysilicon, a conductive metal nitride, a conductive metal oxide, etc.)

In some embodiments, the upper electrode layer may include a first upper electrode film, and a second upper electrode film formed on the first upper electrode film. The first upper electrode film may inhibit hydrogen from reaching to the ferroelectric layer pattern 148 in a subsequent process. For example, the first upper electrode film may be formed using a metal oxide doped with a metal (e.g., strontium ruthenium oxide (SRO), strontium titanium oxide (STO), lanthanum nickel oxide (LNO) and/or calcium ruthenium oxide (CRO), which may be doped with copper, lead or bismuth). The second upper electrode film may be formed using a conductive material (e.g., one or more of a metal, doped polysilicon, a conductive metal nitride, a conductive metal oxide, etc.). For example, the second upper electrode film may be formed using one or more of titanium aluminum nitride, aluminum nitride, titanium nitride, iridium, iridium oxide, platinum, ruthenium or ruthenium oxide, etc.

An upper electrode 153 may be formed on the ferroelectric layer pattern 148 by patterning the upper electrode layer. Accordingly, a ferroelectric capacitor including the lower electrode 136, the ferroelectric layer pattern 148 having an improved surface roughness, and the upper electrode 153 may be manufactured.

Figure 18:
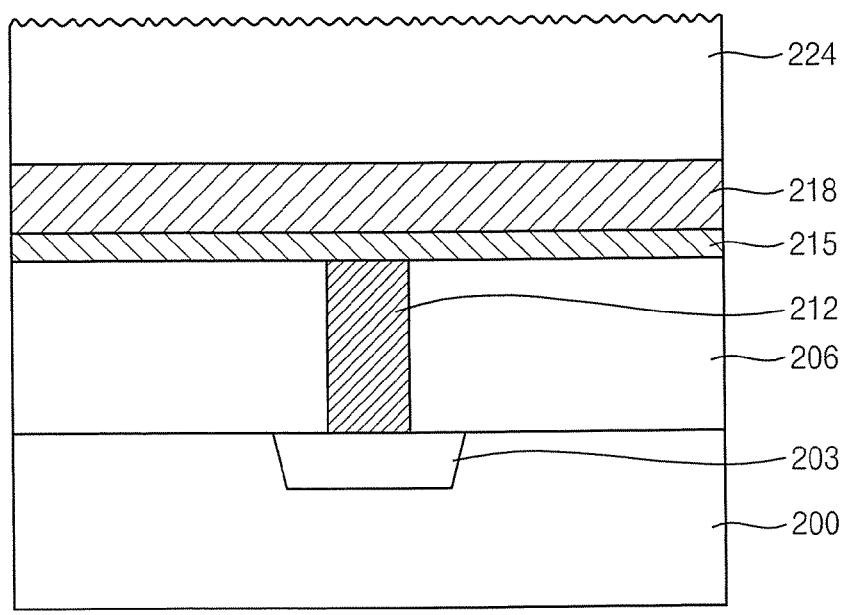
Figure 19:
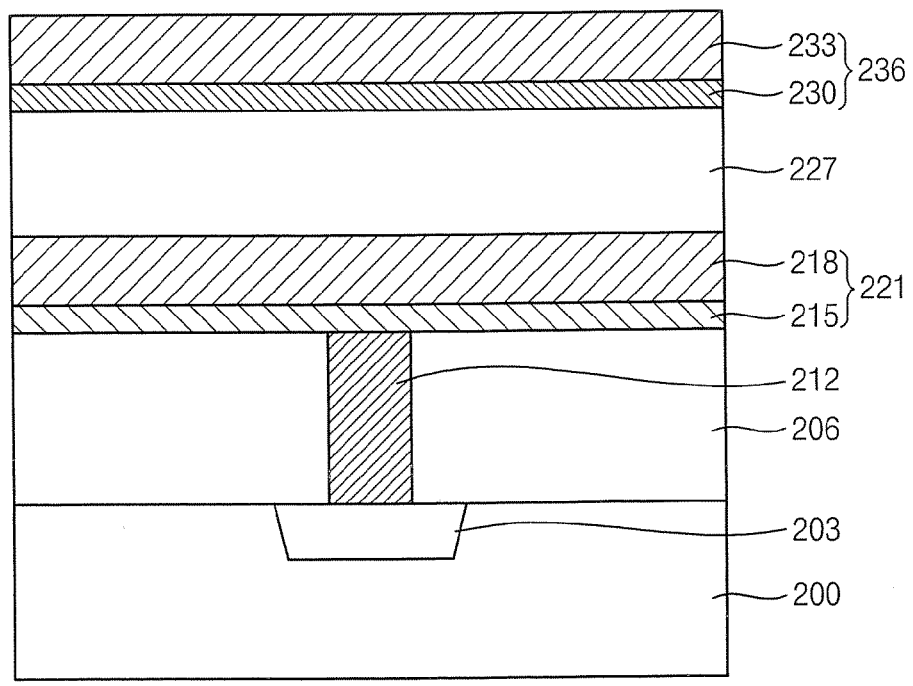
Figure 20:
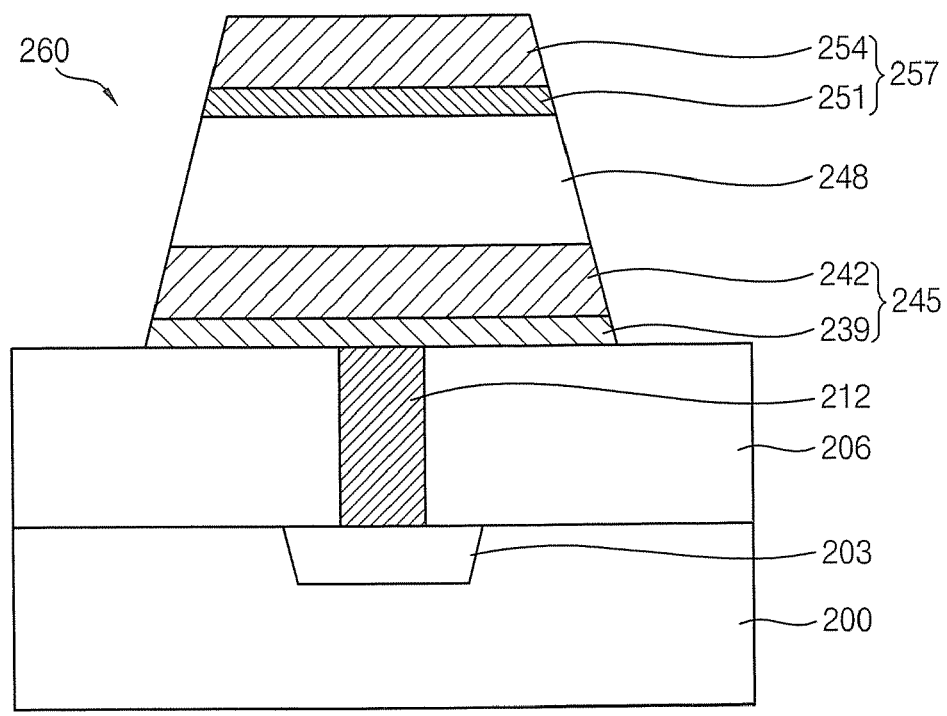

FIGS. 18 through 20 are cross-sectional views illustrating methods of manufacturing a ferroelectric capacitor including a thin ferroelectric layer in accordance with some other embodiments.

Referring to FIG. 18, a substrate 200, on which a lower structure 203, an insulation structure 206, a pad 212, a first lower electrode layer 215, a second lower electrode layer 218 and a preliminary ferroelectric layer 224 are formed, may be prepared by the method similar to the method described with reference to FIGS. 13 and 14.

The preliminary ferroelectric layer 224 including PZT may have a first RMS value of about 30 to about 80 Å, and a first P-V value of about 200 to about 600 Å. The preliminary ferroelectric layer 224 may have a relatively large surface roughness.

Referring to FIG. 19, a polishing process may be performed on the preliminary ferroelectric layer 224 to form a ferroelectric layer 227 having the improved surface roughness. The polishing process may be performed using a slurry composition including an acrylic acid polymer, abrasive particles, and water. The acrylic acid polymer may greatly reduce a polishing rate of the preliminary ferroelectric layer 224, such that the surface roughness of the preliminary ferroelectric layer 224 may be improved while suppressing removal of a bulk portion of the preliminary ferroelectric layer 224. The slurry composition described with reference to FIGS. 1 and 3 may be used in the polishing process.

The thin ferroelectric layer 227 formed by performing the polishing process on the preliminary ferroelectric layer 224 may have a reduced roughness and a flat surface. For example, the thin ferroelectric layer 227 may have a second RMS value of about 1 to about 10 Å, and a second P-V value of about 10 to about 100 Å. The thin ferroelectric layer 227 having the improved surface conditions may reduce a leakage current generated from the thin ferroelectric layer 227, and may prevent deterioration of electrical polarization characteristics at a relatively thin thickness.

An upper electrode layer 236 may be formed on the thin ferroelectric layer 227. For example, a first upper electrode film 230 and a second upper electrode film 233 may be sequentially formed on the thin ferroelectric layer 227.

The first upper electrode film 230 may be formed on the thin ferroelectric layer 227 by a sputtering process, a CVD process, a PLD process or an ALD process. For example, the first upper electrode film 230 may be formed using a metal oxide doped with a metal (e.g., strontium ruthenium oxide (SRO), strontium titanium oxide (STO), lanthanum nickel oxide (LNO) and/or calcium ruthenium oxide (CRO), which may be doped with copper, lead or bismuth). The second upper electrode film 233 may be formed using a metal (e.g., iridium, platinum, ruthenium, palladium and/or gold). The second upper electrode film 233 may be formed by a sputtering process, a CVD process, a PLD process and/or an ALD process.

Referring to FIG. 20, a second photoresist pattern (not illustrated) may be formed on the second upper electrode film 233. The second upper electrode film 233, the first upper electrode film 230, the thin ferroelectric layer 227 and the second lower electrode layer 218 and the first lower electrode layer 215 may be sequentially patterned. As a result, a ferroelectric capacitor 260 may be formed on the substrate 200.

The ferroelectric capacitor 260 may include a lower electrode 245, a thin ferroelectric layer pattern 248 and an upper electrode 257 sequentially formed on the insulation structure 206 and the pad 212. Here, the lower electrode 245 may include a first lower electrode pattern 239 and a second lower electrode pattern 242 sequentially formed on the insulation structure 206 and the pad 212. The upper electrode 257 may include a first upper electrode pattern 251 and a second upper electrode pattern 254 sequentially formed on the thin ferroelectric layer pattern 248.

FIGS. 21 through 25 are cross-sectional views illustrating methods of manufacturing a semiconductor device including a thin ferroelectric layer in accordance with some embodiments.

Figure 21:
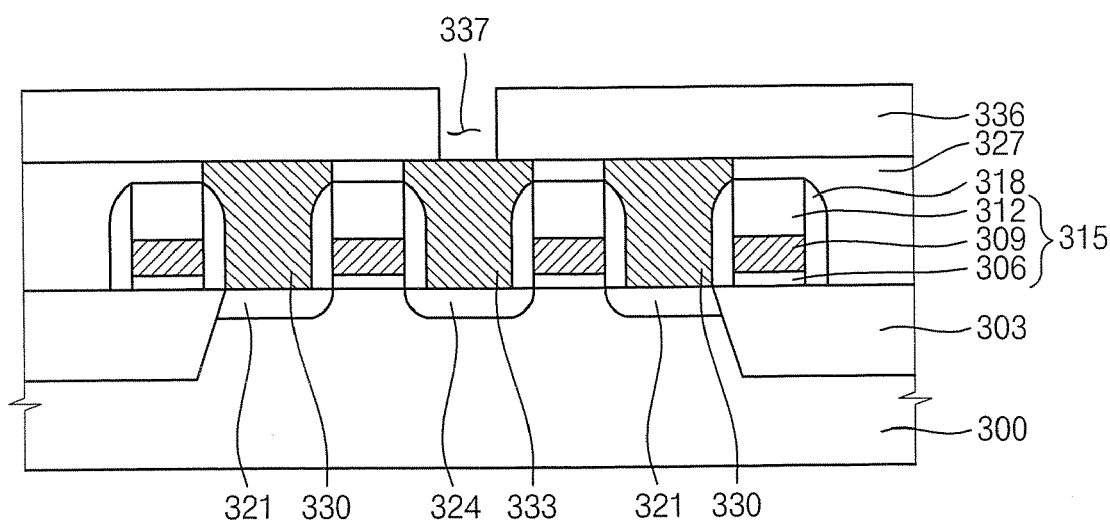

Referring to FIG. 21, an isolation layer 303 may be formed on a semiconductor substrate 300 to define an active region and a field region. The isolation layer 303 may be formed an isolation process such as a shallow trench isolation (STI) process.

A thin gate oxide layer may be formed on the active region of the semiconductor substrate 300. The thin gate oxide layer may be formed on the substrate 300 by a thermal oxidation process or a CVD process.

A first conductive layer and a first mask layer may be sequentially formed on the thin gate oxide layer. The first conductive layer may be formed using polysilicon doped with impurities. Alternatively, the first conductive layer may have a polycide structure that includes doped polysilicon and metal silicide. The first mask layer may be formed using a material that has an etching selectivity relative to that of a first insulating interlayer 327. For example, the first mask layer is formed using a nitride such as silicon nitride when the first insulating interlayer 327 is formed using an oxide.

After a first photoresist pattern (not illustrated) is formed on the first mask layer, the first mask layer, the first conductive layer and the thin gate oxide layer may be etched using the first photoresist pattern as an etching mask. Hence, gate structures 315 are formed on the semiconductor substrate 300. The gate structures 315 include gate oxide layer patterns 306, gate conductive patterns 309 and gate mask patterns 312.

After a first insulation layer may be formed on the substrate 300 to cover the gate structures 315, the first insulation layer may be anisotropically etched to form gate spacers 318 on sidewalls of the gate structures 315. The first insulation layer may be formed using a nitride such as silicon nitride.

Impurities may be implanted into portions of the semiconductor substrate 300 exposed by the gate structures 315 using the gate structures 315 and the gate spacers 318 as ion implantation masks. Therefore, a first contact region 321 and a second contact region 324 are formed at the exposed portions of the semiconductor substrate 300. The first and the second contact regions 321 and 324 may correspond to source/drain regions, respectively. The first and the second contact regions 321 and 324 are divided into a capacitor contact region and a bit line contact region, respectively. A ferroelectric capacitor 384 is electrically connected to the capacitor contact region, and a bit line 339 (see FIG. 22) is electrically connected to the bit line contact region. For example, the first contact region 321 corresponds to the capacitor contact region, and the second contact region 324 corresponds to the bit line contact region. When the first and the second contact regions 321 and 324 are formed, transistors including the gate structures 315 and the contact regions 321 and 324 are completed on the semiconductor substrate 300.

Referring now to FIG. 21, the first insulating interlayer 327 may be formed on the semiconductor substrate 300 to cover the transistors including the gate structures 315. The first insulating interlayer 327 may be formed using an oxide such as one or more of BPSG, PSG, SOG, PE-TEOS, USG, HDP-CVD oxide, etc. The first insulating interlayer 327 may be formed on the semiconductor substrate 300 by one or more of a CVD process, PECVD process, an HDP-CVD process, an ALD process, etc. In example embodiments, an upper portion of the first insulating interlayer 327 may be removed by a CMP process, an etch back process or a combination process of CMP and etch back, thereby planarizing the first insulating interlayer 327.

Portions of the first insulating interlayer 327 may be etched by performing a photolithography process to form first contact holes that expose the first and the second contact regions 321 and 324, respectively. The first contact holes may be self-aligned relative to the gate spacer 318 and the gate mask pattern 312. Some first contact holes may expose the first contact regions 321, and another first contact hole may expose the second contact region 324.

A second conductive layer may be formed on the first insulating interlayer 327 to fill the first contact holes. The second conductive layer may be formed using doped polysilicon, a metal and/or a conductive metal nitride. The second conductive layer may be partially removed by a CMP process, an etch back process or a combination process of CMP and etch back until the first insulating interlayer 327 is exposed. Therefore, a first pad 330 and a second pad 333 are formed in the first contact holes. Since the first contact holes are formed through the self-alignment process, the first and the second pads 330 and 333 also may correspond to self-aligned contact (SAC) pads, respectively. The first pad 330 makes contact with the first contact region 321, and the second pad 333 makes contact with the second contact region 324. For example, the first pad 330 is positioned on the capacitor contact region, and the second pad 333 is formed on the bit line contact region.

Referring again to FIG. 21, a second insulating interlayer 336 may be formed on the first insulating interlayer 327, the first pad 330 and the second pad 333. The second insulating interlayer 336 electrically insulates the first pad 330 from the bit line 339. The second insulating interlayer 336 may be formed using an oxide such as one or more of BPSG, PSG, SOG, PE-TEOS, USG, HDP-CVD oxide, etc. An upper portion of the second insulating interlayer 336 may be planarized by a CMP process, an etch back process or a combination process of CMP and etch back.

The second insulating interlayer 336 may be partially etched by performing a photolithography process. Thus, a second contact hole 337 exposing the second pad 333 may be formed through the second insulating interlayer 336.

Figure 22:
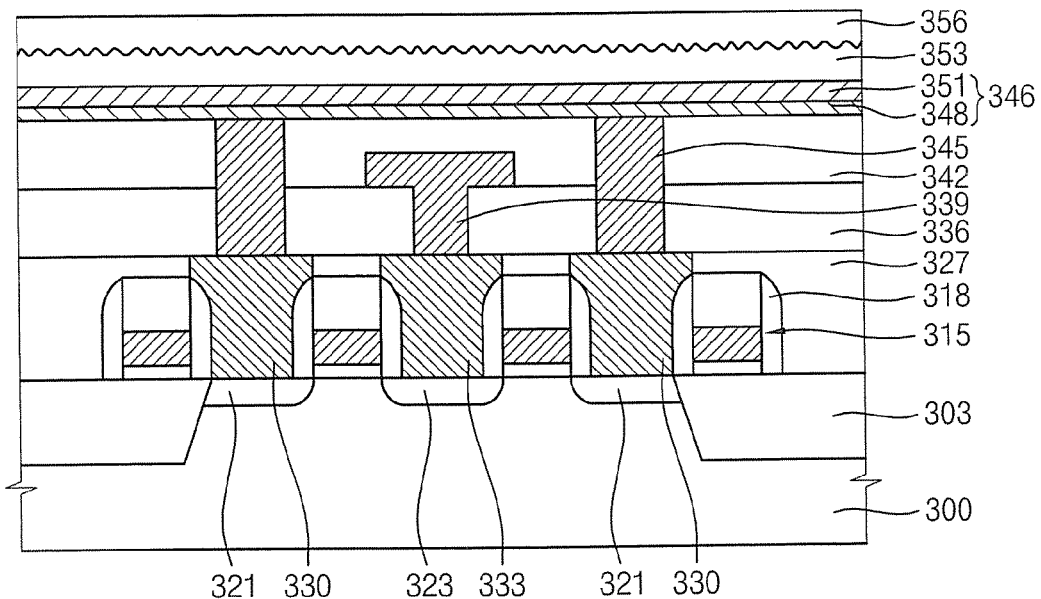

Referring to FIG. 22, a third conductive layer may be formed on the second insulating interlayer 336 to fill the second contact hole 337. A photoresist pattern (not illustrated) may be formed on the third conductive layer, and then the third conductive layer may be etched using the photoresist pattern as an etching mask to form a bit line 339 on the second insulating interlayer 336. The bit line 339 may include a first film of metal/metal nitride and a second film of metal. For example, the first film includes titanium/titanium nitride, and the second film includes tungsten.

A third insulating interlayer 342 may be formed on the second insulating interlayer 336 to cover the bit line 339. The third insulating interlayer 342 may be formed using an oxide such as one or more of BPSG, PSG, SOG, PE-TEOS, USG, HDP-CVD oxide, etc. The third insulating interlayer 342 may be formed using the oxide substantially the same as or different from that of the first insulating interlayer 327 and/or the second insulating interlayer 336.

The third insulating interlayer 342 may be planarized by a CMP process, an etch back process or a combination process of CMP and etch back. In some other embodiments, an additional insulation layer may be formed on the bit line 339 and the second insulating interlayer 336 to inhibit or prevent a void or a seam from occurring at a portion of the third insulating interlayer 342 between adjacent bit lines 339. The additional insulation layer may be formed using a nitride such as silicon nitride. Then, the third insulating interlayer 342 may be formed on the additional insulation layer.

After a photoresist pattern (not illustrated) may be formed on the third insulating interlayer 342, the third insulating interlayer 342 and the second insulating interlayer 336 may be partially etched using the photoresist pattern as an etching mask. Thus, third contact holes 343 exposing the first pads 330 are formed through the third insulating interlayer 342 and the second insulating interlayer 336.

After a fourth conductive layer may be formed on the third insulating interlayer 342 to fill the third contact holes 343, the fourth conductive layer may be partially removed by a CMP process, an etch back process or a combination process of CMP and etch back until the third insulating interlayer 342 is exposed. Thus, third pads 345 are formed in the third contact holes 343, respectively. Each of the third pads 345 may be formed using doped polysilicon or a metal such as tungsten, aluminum, copper, titanium, etc. The third pad 345 electrically connects the first pad 330 to a lower electrode 369 of the ferroelectric capacitor 384 (see FIG. 23). That is, the lower electrode 369 is electrically contacted to the first contact region 321 through the third pad 345 and the first pad 330.

A lower electrode layer 346 is formed on the third pads 345 and the third insulating interlayer 342. The lower electrode layer 346 includes a first lower electrode film 348 and a second lower electrode film 351 sequentially formed on the third pads 345 and the third insulating interlayer 342. The first lower electrode film 348 may be formed using a conductive metal nitride by a CVD process, a sputtering process or an ALD process. The second lower electrode film 351 may be formed using a first metal by a sputtering process, a CVD process, a PLD process or an ALD process.

Referring to FIG. 22, a preliminary ferroelectric layer 353 may be formed on the second lower electrode film 351. The preliminary ferroelectric layer 353 may be formed using a ferroelectric material (PZT, SBT, BLT, PLZT and/or BST), a doped ferroelectric material (PZT, SBT, BLT, PLZT and/or BST doped with calcium, lanthanum, manganese and/or bismuth), and/or a metal oxide. The preliminary ferroelectric layer 353 may be formed by an MOCVD process, a sol-gel process and/or an ALD process. The preliminary ferroelectric layer 353 including PZT may have a first root mean square (RMS) value of about 30 to about 80 Å, and a first peak-to-valley (P-V) value of about 200 to about 600 Å. The preliminary ferroelectric layer 124 may have a relatively large surface roughness. When the surface of a ferroelectric layer is very rough, a data retention or a polarization retention of the ferroelectric layer may deteriorate, and a leakage current generated from the ferroelectric layer may increase.

In one embodiment, a third lower electrode film (not illustrated) may be formed between the second lower electrode layer 351 and the preliminary ferroelectric layer 353. The third lower electrode film may be formed using a metal oxide doped with a metal. For example, the third lower electrode film is formed using SRO, STO, LNO and/or CRO doped with copper, lead and/or bismuth.

A second mask layer 356 may be formed on the preliminary ferroelectric layer 353 by a CVD process, a sputtering process and/or an ALD process. For example, the second mask layer 356 may be formed using an insulation material (e.g., silicon oxide, silicon nitride and/or silicon oxynitride)

In some other embodiments, prior to forming the second mask layer 356, a polishing process for improving a surface roughness of the preliminary ferroelectric layer 353. Thus, a ferroelectric layer (not illustrated) having the improved surface roughness may be formed on the second lower electrode layer 351. The polishing process may be performed using a slurry composition that includes an acrylic acid polymer, abrasive particles, and water. The acrylic acid polymer may greatly reduce a polishing rate of a ferroelectric layer, such that removal of a bulk portion of the preliminary ferroelectric layer 353 may be suppressed while the surface roughness of the preliminary ferroelectric layer 353 being improved.

Figure 23:
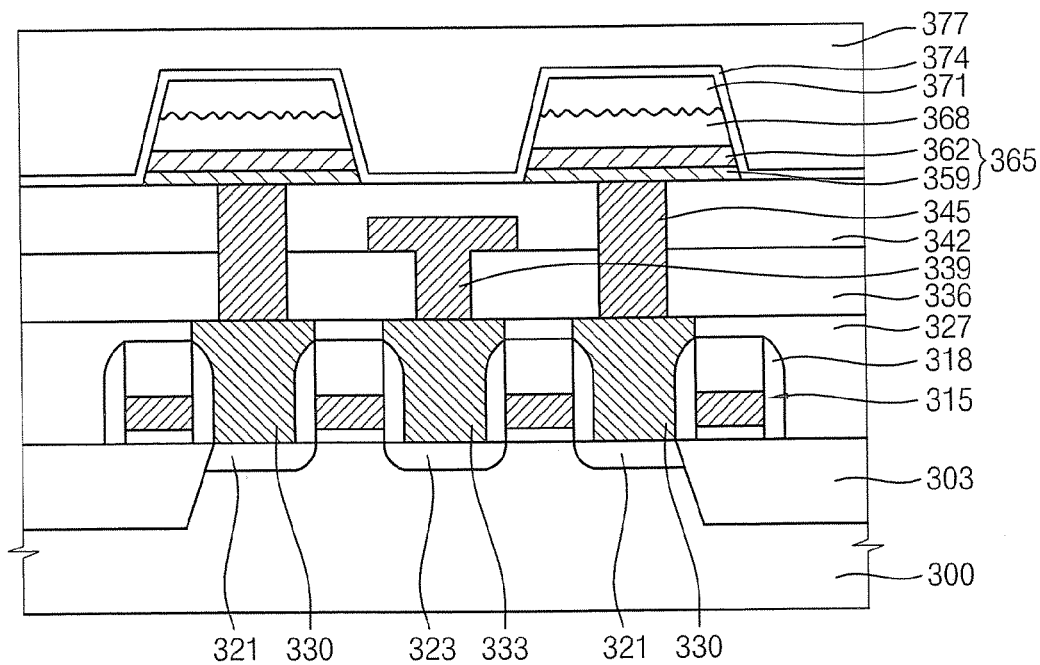

Referring to FIG. 23, a mask layer pattern 371 may be formed on the preliminary ferroelectric layer 353 by performing a photolithography process. For example, a photoresist pattern (not illustrated) is formed on the second mask layer 356, and then the second mask layer 356 may be etched using the photoresist pattern as an etching mask. After forming the mask layer pattern 371, the photoresist pattern may be removed by an ashing process and/or a stripping process.

The preliminary ferroelectric layer 353 and the lower electrode layer 346 may be sequentially patterned using the mask layer pattern 371 as an etching mask. Thus, a preliminary ferroelectric layer pattern 368 and a lower electrode 365 may be sequentially formed on the third pad 345 and the third insulating interlayer 342. The lower electrode 365 may include a first lower electrode 359 and a second lower electrode 362.

A barrier layer 374 may be formed on the third insulating interlayer 342 on which the mask layer pattern 371, the preliminary ferroelectric layer pattern 368 and the lower electrode 365 are formed. The barrier layer 374 may be formed using a metal oxide or a metal nitride. For example, the barrier layer 374 is formed using aluminum oxide, titanium nitride and/or silicon nitride. The barrier layer 374 may be formed by one or more of a CVD process, a sputtering process, a PLD process, an ALD process, etc. The barrier layer 374 may prevent hydrogen atoms from diffusing into the preliminary ferroelectric layer pattern 368 so that the barrier layer 374 may improve electrical characteristics of the preliminary ferroelectric layer pattern 368. However, the barrier layer 374 may be omitted as occasion demands.

A fourth insulating interlayer 377 may be formed on the barrier layer 374. The fourth insulating interlayer 377 may be formed using an oxide such as one or more of BPSG, PSG, SOG, PE-TEOS, USG, HDP-CVD oxide, etc. In example embodiments, the fourth insulating interlayer 377 may be formed using a material substantially the same as or different from that of the mask layer pattern 371.

Figure 24:
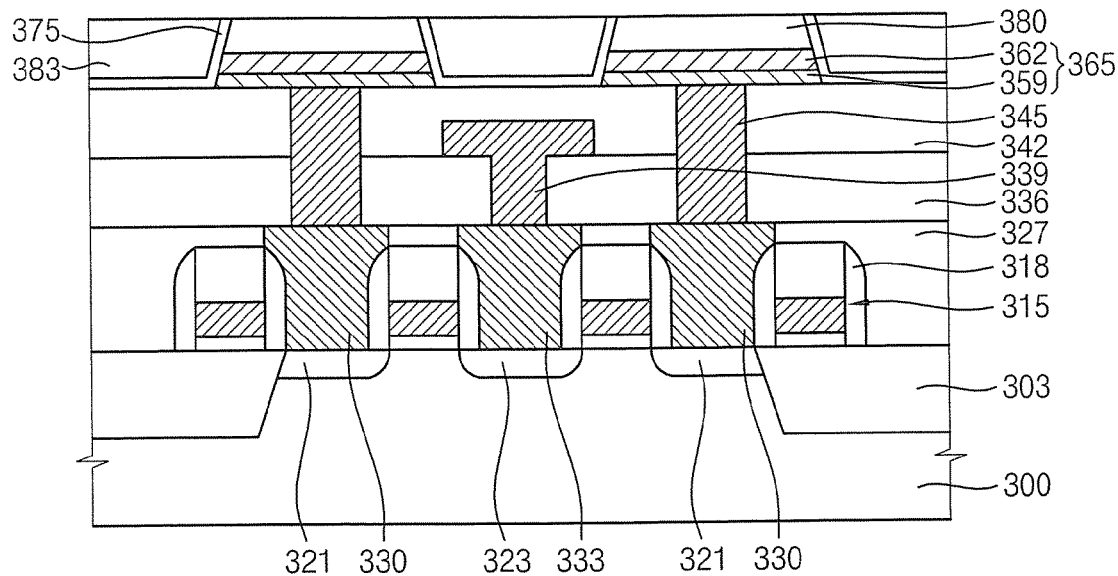

Referring to FIG. 24, a polishing process may be performed on the fourth insulating interlayer 377 until an upper face of the preliminary ferroelectric layer pattern 368 is exposed. Thus, an upper portion of the fourth insulating interlayer 377, an upper portion of the barrier layer 374 and the mask layer pattern 371 may be removed, and a surface portion of the preliminary ferroelectric layer pattern 368 may be polished to enhance a surface roughness thereof. Accordingly, a fourth insulating interlayer pattern 383 and the barrier layer pattern 375 may be formed on the third insulating interlayer 342, and a ferroelectric layer pattern 380 having the improved surface roughness may be formed on the lower electrode 365. In some embodiments, the preliminary ferroelectric layer pattern 368 may be provided as a polishing stop layer in the polishing process for removing upper portions of the fourth insulating interlayer 377 and the mask layer pattern 371.

The polishing process may be performed using a slurry composition including an acrylic acid polymer, abrasive particles, and water. The acrylic acid polymer may selectively reduce a polishing rate of a ferroelectric layer relative to a polishing rate of an insulating material. Therefore, the slurry composition may rapidly remove the fourth insulating interlayer 377 and the mask layer pattern 371, and may also suppress removal of a bulk portion of the preliminary ferroelectric layer 368. Further, the surface roughness of the preliminary ferroelectric layer 368 may be simultaneously improved by the polishing process.

The ferroelectric layer pattern 380 may have a reduced roughness and a flat surface. For example, the ferroelectric layer pattern 380 may have a second RMS value of about 1 to about 10 Å, and a second P-V value of about 10 to about 100 Å. The ferroelectric layer pattern 380 having the improved surface conditions may reduce a leakage current generated from the ferroelectric layer pattern 380, and may also suppress deterioration of a data retention and/or polarization retention at a relatively thin thickness.

Figure 25:
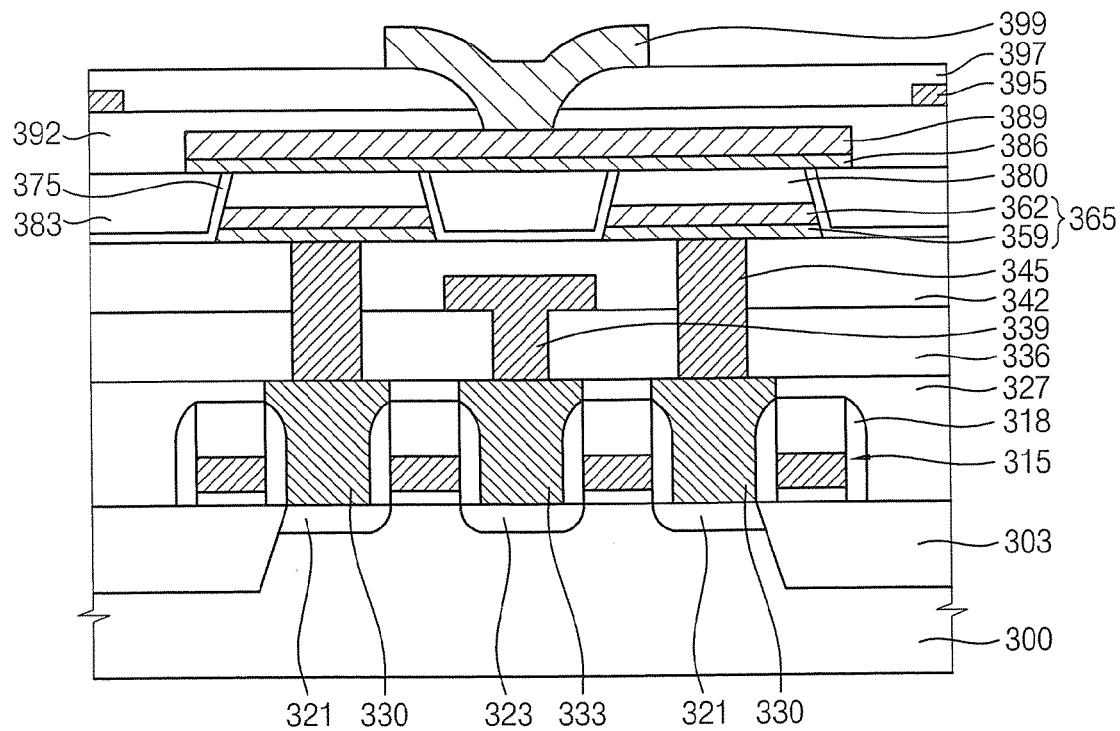

Referring to FIG. 25, an upper electrode layer may be formed on the ferroelectric layer pattern 380 and the fourth insulating interlayer pattern 383. The upper electrode layer may include a first upper electrode film and a second upper electrode film. The first upper electrode film may prevent hydrogen from diffusing into the ferroelectric layer pattern 380. For example, the first upper electrode film may be formed using a metal oxide doped with a metal (e.g., strontium ruthenium oxide (SRO), strontium titanium oxide (STO), lanthanum nickel oxide (LNO) and/or calcium ruthenium oxide (CRO), which may be doped with copper, lead and/or bismuth). The second upper electrode film may be formed using a conductive material (e.g., one or more of a metal, doped polysilicon, a conductive metal nitride, a conductive metal oxide, etc.). For example, the second upper electrode film may be formed from one or more of titanium aluminum nitride, aluminum nitride, titanium nitride, iridium, iridium oxide, platinum, ruthenium or ruthenium oxide, etc.

The upper electrode layer may be patterned by performing a photolithography process. Thus, an upper electrode including a first upper electrode 386 and a second upper electrode 389 may be formed on the ferroelectric layer pattern 380. Accordingly, a ferroelectric capacitor including the lower electrode 365, the ferroelectric layer pattern 380 having the improved surface roughness and the upper electrode may be manufactured.

In other example embodiments, a polishing process may be performed on the preliminary ferroelectric layer 353 without forming the mask layer 365 to improve the surface roughness of the preliminary ferroelectric layer 353. In such case, a ferroelectric layer (not illustrated) having the improved surface roughness may be formed on the lower electrode layer 346. After forming the planarized ferroelectric layer, an upper electrode layer (not illustrated) may be formed on the ferroelectric layer. The upper electrode layer, the planarized ferroelectric layer and the lower electrode layer 346 may be sequentially patterned by a photolithography process. Thus, a ferroelectric capacitor including a lower electrode (not illustrated), a planarized ferroelectric layer pattern (not illustrated) and an upper electrode (not illustrated) may be formed on the third insulating interlayer 342. Further, a barrier layer (not illustrated) and a fourth insulating interlayer (not illustrated) may be sequentially formed on the ferroelectric capacitor and the third insulating interlayer 342. A polishing process may be performed on the fourth insulating interlayer until the upper electrode is exposed to form a fourth insulating interlayer pattern (not illustrated).

Referring now to FIG. 25, a fifth insulating interlayer 392 may be formed on the fourth insulating interlayer pattern 383 and the upper electrode 386, 389. In example embodiments, a metal wiring 395 may be formed on the fifth insulating interlayer 392. A sixth insulating interlayer 397 may be formed on the fifth insulating interlayer 392 to cover the metal wiring 395, and then the sixth and the fifth insulating interlayer 397 and 392 may be sequentially etched to form a hole exposing a portion of the second upper electrode 389.

A fifth conductive layer may be formed on the sixth insulating interlayer 397 to fill the hole. The fifth conductive layer may be patterned by a photolithography process to form an upper wiring 399 on the sixth insulating interlayer 397 to fill the hole. Accordingly, a FRAM device having a ferroelectric capacitor may be manufactured.

Figure 26:
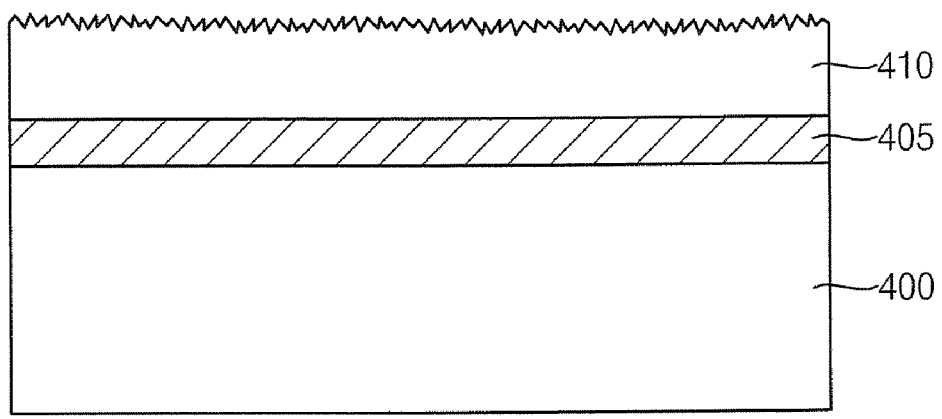
Figure 27:
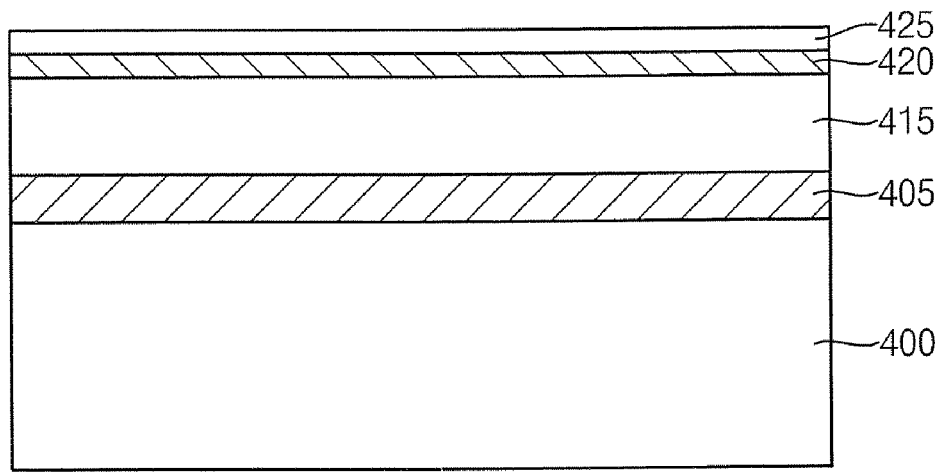
Figure 28:
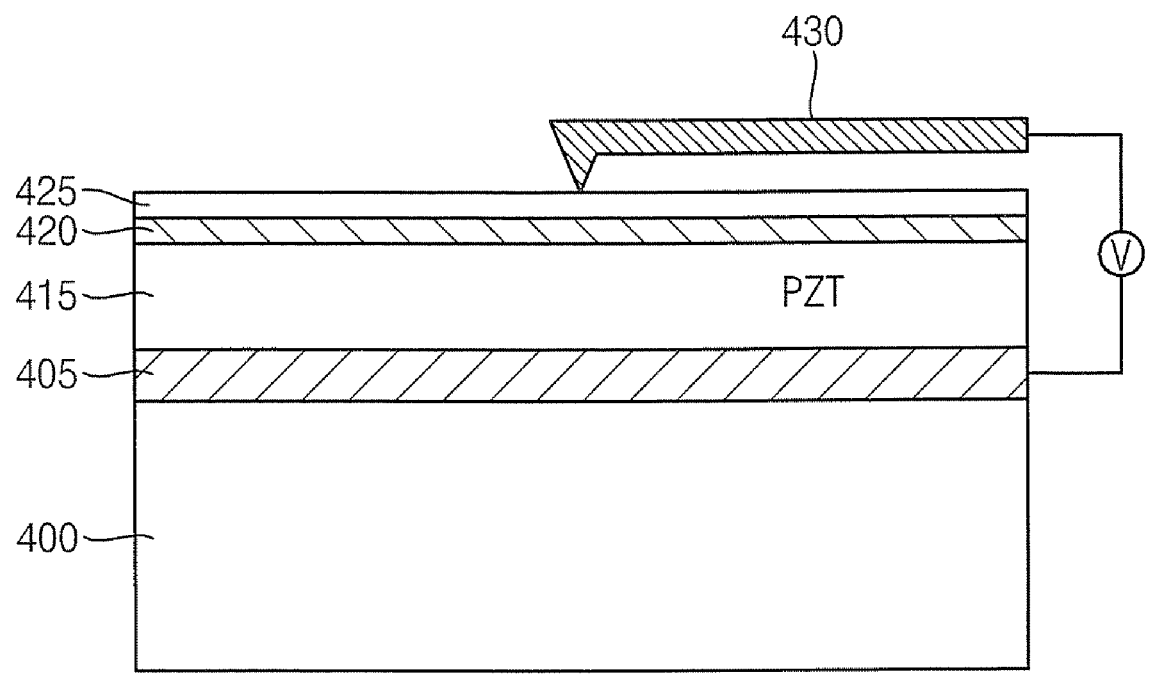

FIGS. 26 through 28 are cross-sectional views illustrating methods of manufacturing a semiconductor device including a thin ferroelectric layer in accordance with some other embodiments.

Referring to FIG. 26, an electrode 405 may be formed on a substrate 400, and then a preliminary ferroelectric layer 410 may be formed on the electrode 405. The substrate 400, the electrode 405 and/or the preliminary ferroelectric layer 410 may be the same as the substrate 10, the conductive structure 12 and the preliminary ferroelectric layer 14 described with reference to FIG. 2.

In some embodiments, the electrode 405 may be obtained by sequentially forming a first electrode layer and a second electrode layer. The first electrode layer may be a barrier layer of inhibiting diffusion of an element from the preliminary ferroelectric layer 410. The first electrode layer may be formed using a metal nitride. The second electrode layer may be formed using a metal or a metal oxide (e.g., Ir, Pt, Ru, IrxRu1-x, $IrO_2$ and/or $RuO_3$) to improve crystallinity of the preliminary ferroelectric layer 410.

The preliminary ferroelectric layer 410 may have a first RMS value in a range of about 30 to about 80 Å, and a first P-V value of about 200 to about 600 Å. That is, the surface of the preliminary ferroelectric layer 410 may be relatively rough. Such rough surface of the preliminary ferroelectric layer 410 may also provide a rough surface of a semiconductor layer 425 (see FIG. 27). Accordingly, a tip of a probe 430 (see FIG. 28) which contacts the semiconductor layer 425 to read or write data may severely and rapidly worn out, and even sliding of the probe 430 on the semiconductor layer 425 may be difficult.

Referring to FIG. 27, the surface of the preliminary ferroelectric layer 410 may be chemically and mechanically polished using a slurry composition. By polishing the surface of the preliminary ferroelectric layer 410, a thin ferroelectric layer 415 having the improved surface roughness may be formed on the electrode 405.

In example embodiments, the slurry composition may include an acrylic acid polymer, abrasive particles, and water. The acrylic acid polymer may reduce a polishing rate of the ferroelectric layer. The slurry composition may suppress removal or polishing of a bulk portion of the preliminary ferroelectric layer 410 and may also selectively planarize a surface portion of the preliminary ferroelectric layer 410. Accordingly, deterioration of electrical polarization of the thin ferroelectric layer 415, which may be caused by decrease of a thickness, may be reduced.

The thin ferroelectric layer 415 may have a reduce roughness and a flat surface. For example, the thin ferroelectric layer 415 may have a second RMS in a range of about 1 to about 10 Å, and a second P-V value in a range of about 10 to about 100 Å. The thin ferroelectric layer 415 having the improved surface conditions may reduce damage of the probe 430 reading and/or writing data, and may also enhance a lifetime of the probe 430. Further, deterioration of data retention or a polarization retention or generation of leakage current may be suppressed.

In some embodiments, the thin ferroelectric layer 415 may be additionally cleaned and cured. The cleaning process and the curing process may be the same as those described with reference to FIGS. 1 and 3.

Referring to FIGS. 27 and 28, a barrier layer 420 and a semiconductor layer 425 may be sequentially formed on the ferroelectric layer 415, and then a probe 430 may be arranged over the semiconductor layer 425.

The barrier layer 420 may protect oxidation of the thin ferroelectric layer 415. The barrier layer 420 may be formed using a metal oxide or a nitride. The barrier layer 420 may also prevent any reaction between materials of the thin ferroelectric layer and the semiconductor layer 425. The semiconductor layer 425 may be formed using a material capable of forming a Schottky junction with respect to the probe 430. For example, the semiconductor layer 425 may be formed using a semiconductor material (e.g., silicon doped with impurities). The probe 430 may be formed using a metal (e.g., Au or Pt) or a semiconductor material (e.g., silicon) to form a Schottky junction together with the semiconductor layer 425. Accordingly, a probe memory device having improved electrical characteristics and durability may be manufactured.

According to some embodiments, a ferroelectric layer may be polished with a reduced polishing rate using a slurry composition including an acrylic acid polymer. Even though a polishing pressure and a rotational speed of a polishing pad are not substantially reduced, removal of a bulk portion of the ferroelectric layer may be suppressed and a rough surface portion of the ferroelectric layer may be selectively planarized. Therefore, a polishing efficiency may be maintained, and deterioration of ferroelectric characteristics caused by a thickness decrease may also be reduced. Further, the acrylic acid polymer may hold a rapid polishing rate of an insulation layer, and may selectively reduce a polishing rate of a ferroelectric layer. Thus, a polishing selectivity of the insulation layer relative to the ferroelectric layer may be greatly enhanced. By using the slurry composition having such a high polishing selectivity, the insulation layer may be rapidly polished or removed while suppressing excessive removal the ferroelectric layer provided as a polishing stop layer.

The ferroelectric layer formed by the polishing process may have greatly improved surface roughness. Thus, deterioration of data retention and/or polarization retention may be suppressed at a relatively thin thickness, and generation of a leakage current may be reduced. Accordingly, electrical characteristics of a FRAM device including the ferroelectric layer may be enhanced. Further, a probe memory device having improved durability and electrical characteristics may be obtained.

The foregoing is illustrative of example embodiments and is not to be construed as limiting thereof. Although a few example embodiments have been described, those skilled in the art will readily appreciate that many modifications are possible in the example embodiments without materially departing from the novel teachings of example embodiments. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it may be to be understood that the foregoing may be illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a thin ferroelectric layer, comprising:
   forming a preliminary ferroelectric layer on a substrate;
   forming an insulation layer on the preliminary ferroelectric layer;
   performing a polishing process on the insulation layer using a slurry composition to remove the insulation layer from the preliminary ferroelectric layer, the slurry composition including an acrylic acid polymer, abrasive particles, and water; and
   polishing a surface of the preliminary ferroelectric layer using the slurry composition to form a thin ferroelectric layer on the substrate.

2. The method of claim 1, wherein the preliminary ferroelectric layer is formed by a metal organic chemical vapor deposition process.

3. The method of claim 1, wherein the preliminary ferroelectric layer is formed using a metal oxide including lead, zirconium and titanium.

4. The method of claim 1, wherein polishing the surface of the preliminary ferroelectric layer comprises planarizing a surface of the preliminary ferroelectric layer while suppressing removal of a bulk portion of the preliminary ferroelectric layer.

5. The method of claim 1, wherein the surface of the preliminary ferroelectric layer is polished using the slurry composition including the acrylic acid polymer in an amount ranging from about 0.01 to about 1.0 wt %.

6. The method of claim 5, wherein the surface of the preliminary ferroelectric layer is polished using the slurry composition including the acrylic acid polymer in an amount ranging from about 0.08 to about 0.12 wt %.

7. The method of claim 1, wherein the surface of the preliminary ferroelectric layer is polished using the slurry composition including ceria abrasive particles.

8. The method of claim 1, wherein the polishing process is performed using the preliminary ferroelectric layer as a polishing stop layer until the preliminary ferroelectric layer is exposed.

9. The method of claim 1, wherein polishing the surface of the preliminary ferroelectric layer is performed by a polishing process substantially the same as the polishing process for removing the insulation layer.

10. The method of claim 9, wherein a polishing selectivity of the insulation layer to the preliminary ferroelectric layer is in a range of about 20:1 to about 100:1.

11. The method of claim 1, wherein polishing the surface of the preliminary ferroelectric layer is performed using a chemical mechanical polishing apparatus that includes a carrier for mounting the substrate and a polishing pad contacting the surface of the preliminary ferroelectric layer.

12. The method of claim 10, further comprising pressing the substrate and the polishing pad together with a pressure in a range of about 1 to about 5 psi, and rotating the polishing pad at a speed in a range of about 10 to about 120 rpm.

13. The method of claim 1, wherein the thin ferroelectric layer has an RMS value in a range of about 1 Å to about 10 Å, and a P-V value in a range of about 10 Å to about 100 Å.

14. A method of manufacturing a semiconductor device, comprising:
   forming a lower electrode on a substrate;
   forming a preliminary ferroelectric layer on the lower electrode;
   forming an insulation layer on the preliminary ferroelectric layer;
   performing a polishing process using a slurry composition until the preliminary ferroelectric layer is exposed to remove the insulation layer from the preliminary ferroelectric layer, the slurry composition including an acrylic acid polymer, abrasive particles and water; and
   polishing a surface of the preliminary ferroelectric layer using the slurry composition to form a thin ferroelectric layer on the lower electrode;
   forming an upper electrode on the thin ferroelectric layer.

15. The method of claim 14, wherein polishing the surface of the preliminary ferroelectric layer is performed by a polishing process substantially the same as the polishing process for removing the insulation layer.

16. The method of claim 14, wherein a polishing selectivity of the insulation layer to the preliminary ferroelectric layer is in a range of about 20:1 to about 100:1.

* * * * *